US006943117B2

(12) United States Patent
Jeong et al.

(10) Patent No.: US 6,943,117 B2
(45) Date of Patent: Sep. 13, 2005

(54) UV NANOIMPRINT LITHOGRAPHY PROCESS USING ELEMENTWISE EMBOSSED STAMP AND SELECTIVELY ADDITIVE PRESSURIZATION

(75) Inventors: Jun-Ho Jeong, Daejeon (KR); HyonKee Sohn, Daejeon (KR); Young-Suk Sim, Seoul (KR); Young-Jae Shin, Daejeon (KR); Eung-Sug Lee, Daejeon (KR); Kyung-Hyun Whang, Daejeon (KR)

(73) Assignee: Korea Institute of Machinery & Materials, Daejeon (KR)

( * ) Notice: Subject to any disclaimer, the term of this patent is extended or adjusted under 35 U.S.C. 154(b) by 0 days.

(21) Appl. No.: 10/464,506

(22) Filed: Jun. 19, 2003

(65) Prior Publication Data

US 2004/0192041 A1 Sep. 30, 2004

(30) Foreign Application Priority Data

Mar. 27, 2003 (KR) ................................ 10-2003-0019310
May 26, 2003 (KR) ................................ 10-2003-0033494

(51) Int. Cl.[7] ................................................ H01L 21/47

(52) U.S. Cl. ....................... 438/694; 438/780; 438/782; 438/795; 977/DIG. 1

(58) Field of Search ................................ 438/694, 700, 438/780, 782, 795; 977/DIG. 1

(56) References Cited

U.S. PATENT DOCUMENTS 5,772,905 A * 6/1998 Chou .......................... 216/44
6,517,977 B2 * 2/2003 Resnick et al. ................ 430/5
6,656,398 B2 * 12/2003 Birch et al. ................... 264/85
2003/0215577 A1 * 11/2003 Willson et al. ............. 427/458
2004/0009673 A1 * 1/2004 Sreenivasan et al. ....... 438/694

* cited by examiner

*Primary Examiner*—Stephen W. Smoot
(74) *Attorney, Agent, or Firm*—Harness, Dickey & Pierce, P.L.C.

(57) ABSTRACT

A UV nanoimprint lithography process for forming nanostructures on a substrate. The process includes depositing a resist on a substrate; contacting a stamp having formed thereon nanostructures at areas corresponding to where nanostructures on the substrate are to be formed to an upper surface of the resist, and applying a predetermined pressure to the stamp in a direction toward the substrate, the contacting and applying being performed at room temperature and at low pressure; irradiating ultraviolet rays onto the resist; separating the stamp from the resist; and etching an upper surface of the substrate on which the resist is deposited. The stamp is an elementwise embossed stamp that comprises at least two element stamps, and grooves formed between adjacent element stamps and having a depth that is greater than a depth of the nanostructures formed on the element stamps.

31 Claims, 22 Drawing Sheets

UV NANOIMPRINT LITHOGRAPHY PROCESS USING ELEMENTWISE EMBOSSED STAMP AND SELECTIVELY ADDITIVE PRESSURIZATION

BACKGROUND OF THE INVENTION (a) Field of the Invention

The present invention relates to a UV nanoimprint lithography process, and more particularly, to a UV nanoimprint lithography process in which nanostructures are produced by pressing an elementwise embossed stamp on a resist deposited on a substrate to transfer nanostructures.

(b) Description of the Related Art

UV nanoimprint lithography technology enables the economic and effective production of nanostructures. To perform UV nanoimprint lithography, it is necessary to use nanoscale materials technology, stamp manufacturing technology, anti-adhesive layer technology, etching technology, measurement analysis technology, etc. It is also necessary to use nanoscale precision control technology in the process.

Nanoimprint lithography has a high possibility of being applied to the production of high-speed nanoscale MOSFETs (metal-oxide-semiconductor field-effect transistors), MESFETs (metal-semiconductor field-effect transistors), high density magneto-registers, high density CDs (compact disks), nanoscale MSM PDs (metal-semiconductor-metal photodetectors), high speed single-electron transistor memories, etc.

In the nanoimprint process first developed in 1996 by Chou, et al. of Princeton University, a stamp, which has a nanoscale structure manufactured by using the electron beam lithography process, is pressed onto a substrate, which is coated with a thin layer of PMMA (polymethylmethacrylate) in a high temperature environment. After being cooled, the stamp is separated from the resist. Accordingly, the nanostructures on the stamp are transferred onto the resist. Using an anisotropic etching process, they are then transferred onto the substrate, which is generally a silicon wafer.

In 2001, Chou et al. developed the laser-assisted direct imprint (LADI), a nanoimprint technique. This technique uses a single 20 ns excimer laser of a 308 nm wavelength to instantly melt a silicon wafer or a resist coated on a silicon wafer to perform imprinting with a transparent stamp. Further, in a similar process of the nanosecond laser-assisted nanoimprint lithography (LA-NIL) applied to polymers, a nanostructure of 100 nm in width and 90 nm in depth is imprinted on a resist of a polymer.

These nanoimprint technologies are performed at high temperatures. In the development of semiconductor devices requiring multi-layer operations, thermal deformation caused by the high temperatures makes it difficult to successfully perform the multi-layer alignment. Further, in order to perform imprinting of a resist with a high viscosity, a high pressure approximately as high as 30 bar is needed, which is liable to damage to the previously produced nanostructure. An opaque stamp used in these processes makes the multilayer alignment even harder.

To address these problems, Sreenivasan et al. of the University of Texas at Austin developed the step and flash imprint lithography (SFIL) in 1999. In SFIL, UV-curable resins are used to produce nanostructures at room temperature and at low pressure. Transparent materials transmitting UV lights such as quartz and Pyrex glass, etc. are used as the stamp material.

In SFIL, a transfer layer is first spin-coated on a silicon substrate. Next, in a state where a transparent stamp is maintained at a predetermined small gap with the transfer layer, a UV-curable resin with a low viscosity is filled in nanostructures of the stamp and by capillary force. When filling of the nanostructure is complete, the stamp is contacted to the transfer layer and ultraviolet rays are irradiated onto the stamp to harden the resin. The stamp is then separated from the transfer layer, followed by an etching process and a lift-off process to thereby complete patterning of the substrate.

SFIL is a step-and-repeat type nanoimprint process, in which a stamp, relatively smaller than the substrate, is used to repeatedly perform imprinting over the entire substrate. Although nanostructures of the stamp are quickly filled due to the small area of the stamp, the need to repeatedly align the stamp and perform multiple imprinting processes for a substrate increases the overall production time.

In order to effectively perform imprinting on a large substrate, with reference to FIGS. 19A and 19B, nanostructures 103 should be formed on a single stamp 6 as large as the substrate, and the stamp 6 be pressed against a resist 20 deposited on an upper surface of the substrate 5. Nanostructures corresponding to the shape of the nanostructures 103 formed on the stamp 6 are therefore transferred onto the substrate 5. However, the resist 20, which has a low viscosity, flows only toward edges of the substrate 5 by the pressure applied by the stamp 6 as shown in FIG. 19B (in the direction of the arrows). Thus, in case that the distribution of the resist 20 in inner areas of the substrate 5 is uneven, or there are impurities such as air in the resist 20, the resist 20 cannot be fully filled in the nanostructures 103 formed on the stamp 6.

Because of flatness errors of a stamp for UV nanoimprint lithography and the working surface of a substrate (e.g., 20–30 $\mu$m for a Si wafer substrate), the resist cannot be uniformly imprinted by the stamp during the imprinting process. In order to prevent such non-uniform nanoimprinting of the resist by the small stamp in SFIL, the distances between the stamp face and the substrate is controlled using four distance sensors, each of which is mounted on each side of the stamp. The positioning of the stamp is then varied according to the resulting distance measurements to thereby maximally level the stamp face with respect to the substrate surface. That is, imprinting is performed after adjusting the planar angles of the stamp surface on which nanostructures are engraved according to the waviness of the substrate surface.

However, increase in sizes of the stamp and the substrate results in greater flatness errors such that the resist has even more areas of insufficient and non-uniform imprinting, i.e., the resist does not fully or not uniformly fill the nanostructures. Also, with the non-uniformly imprinted resist on a substrate, difficulties arise in the etching process, which is used for transcribing the nanostructures on the substrate.

SUMMARY OF THE INVENTION

It is an advantage of the present invention to provide a UV nanoimprint lithography process that uses an elementwise embossed stamp, which has formed on one side thereof element stamps divided by grooves, in a UV nanoimprint lithography process such that residual resist flows into the grooves between the element stamps during the lithography process. As a result, each element stamp is completely filled, and high-precision and high-quality nanostructures can be quickly formed on a large substrate.

It is another advantage of the present invention to provide a UV nanoimprint lithography process in which supplementary pressure is selectively applied in the lithography process in the case where resist is insufficiently or non-uniformly imprinted as a result of flatness errors of a stamp and a substrate, thereby enabling the use of large stamps to quickly form high-precision and high-quality nanostructures on a large substrate.

The UV nanoimprint lithography process for forming nanostructures on a substrate includes depositing a resist on a substrate; contacting a stamp having formed-thereon stamp nanostructures at areas corresponding to where nanostructures on the substrate are to be formed to an upper surface of the resist, and applying a predetermined pressure to the stamp in a direction toward the substrate, the contacting and applying being performed at room temperature and low pressure; irradiating ultraviolet rays onto the resist; relieving the stamp from the resist; and etching an upper surface of the substrate on which the resist is imprinted. The stamp is an elementwise embossed stamp that comprises at least two element stamps, and grooves which are formed between adjacent stamps having a depth that is greater than a depth of the nanostructures formed on the element stamps.

The elementwise embossed stamp is formed such that the depth of the grooves is between 2 and 1000 times greater than the depth of the nanostructures formed on the element stamps, and the grooves formed between the element stamps of the elementwise embossed stamp are formed with slanted side walls.

The elementwise embossed stamp is made of transparent materials selected from the group consisting of quartz, glass, sapphire, and diamond, all of which transmits the ultraviolet rays. Also, the elementwise embossed stamp is formed by defining the nanostructures on each of the element stamps using the microfabrication process on a surface of a plate, and forming the grooves between the element stamps.

The grooves can be formed using dicing or etching.

The elementwise embossed stamp is formed by cutting a UV-transmitting plate on which nanostructures are engraved into each element stamp, and adhering each element stamp at predetermined intervals to a UV-transmitting plate.

The adhering of the element stamps comprises forming shallow grooves or through holes at predetermined intervals on one side of a UV-transmitting plate, and inserting the element stamps into the grooves or the through holes.

An adhesive used in the adhering of the element stamps loses its adhesivity at a predetermined temperature or greater, thereby allowing the element stamps to be selectively and individually replaced.

The deposition of a resist on a substrate is realized through spin coating or droplet dispensing. The droplet dispensing method includes directly dispensing resist droplets on each of the element stamps of the elementwise embossed stamp.

In another aspect, the depositing of a resist on a substrate is realized through a spray method. The spray method includes positioning a mask having formed therein openings corresponding to positions of each of the element stamps of the elementwise embossed stamp, and spraying the resist onto the mask to thereby deposit the resist on the substrate.

In another aspect, a UV nanoimprint lithography process for forming nanostructures on a substrate includes depositing a resist on a substrate; contacting a stamp having formed thereon nanostructures at areas corresponding to where nanostructures on the substrate are to be formed to an upper surface of the resist, and applying a predetermined pressure to the stamp in a direction toward the substrate, the contacting and applying being performed at room temperature and at low pressure; sensing areas of the resist that are insufficiently or non-uniformly imprinted; selectively applying a supplementary pressure to the areas of the resist that are insufficiently or non-uniformly imprinted; irradiating ultraviolet rays onto the resist; separating the stamp from the resist; and etching an upper surface of the substrate on which the resist is deposited. The stamp is a flat stamp on which nanostructures are engraved. Also, the stamp is an elementwise embossed stamp that comprises at least two element stamps, and grooves formed between adjacent stamps having a depth that is greater than a depth of nanostructures formed on the element stamps.

The sensing areas of the resist that are insufficiently or non-uniformly imprinted includes measuring a thickness of a resist layer deposited on the substrate using an optical measuring device. Also, the sensing of areas of the resist that are insufficiently compressed includes sensing areas of compressed resist droplets that are less spread out than an area of the nanostructures engraved into the stamp, the sensing being performed using an optical measuring device from above the stamp.

The applying of a supplementary pressure includes applying a supplementary pressure to the back side of the substrate. The applying of the supplementary pressure to the back side of the substrate includes forming at least one hole in a table on which the substrate is placed, and installing a supplementary pressure device(s) in the hole(s) to apply the supplementary pressure. The supplementary pressure device is a piezoelectric actuator or a spring-screw mechanism. Further, the supplementary pressure device includes a plunger that provides surface contact to the back side of the substrate, or a plunger that provides point contact to the back side of the substrate.

The applying of a supplementary pressure includes applying a supplementary pressure from an upper surface of the stamp. The supplementary pressure is applied using supplementary pressure devices provided to corner areas of the stamp. The supplementary pressure device includes a plunger that provides surface contact to the upper surface of the stamp, or a plunger that provides point contact to the upper surface of the stamp.

An operational system for the selective application of supplementary pressure in a UV nanoimprint lithography process for forming nanostructures on a substrate includes a substrate table on which the substrate deposited with a resist is placed, and includes at least one hole passing through to a surface making contact with the substrate; an optical measuring device mounted above the substrate for sensing a compression state of the resist deposited thereon; a supplementary pressure device mounted in the hole formed in the substrate table, and applying a supplementary pressure to the backside of the substrate; a device controller connected to the supplementary pressure device and controlling an operation of the supplementary pressure device; and a feedback controller connected to both the supplementary pressure device and the device controller, and transmitting operational signals to the device controller according to a compressed state of the resist sensed by the optical measuring device.

BRIEF DESCRIPTION OF THE DRAWINGS

The accompanying drawings, which are incorporated in and constitute a part of the specification, illustrate embodiments of the invention, and, together with the description, serve to explain the principles of the invention.

DETAILED DESCRIPTION

Embodiments of the present invention will now be described in detail with reference to the accompanying drawings.

FIGS. 1A to 1F are sectional views used to describe a UV nanoimprint lithography process according to an embodiment of the present invention.

Figure 1A:
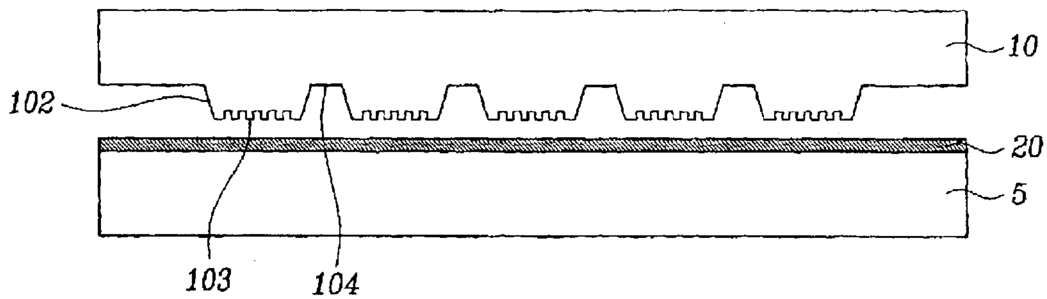
FIGS. 1A to 1F are sectional views used to describe a UV nanoimprint lithography process according to an embodiment of the present invention.

In order to form nanostructures 5*a* on a substrate 5, a resist 20 is first deposited on the substrate 5 as shown in FIG. 1A. It is preferable that a UV-curable polymer material be used for the resist 20.

Figure 1B:
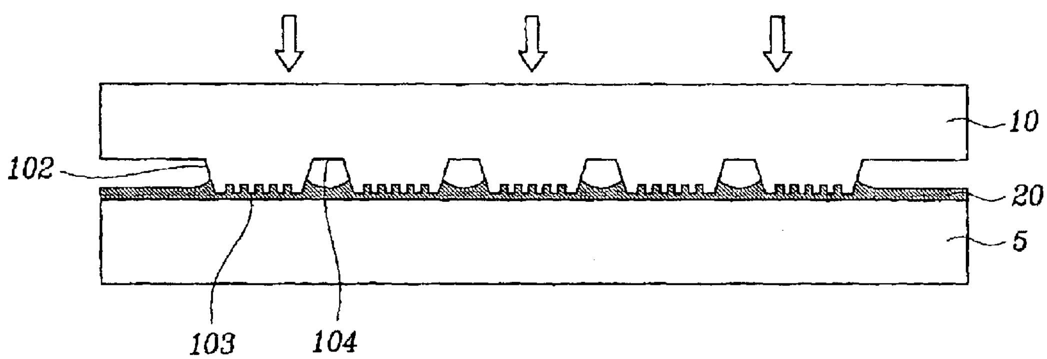

Next, a stamp 10 having formed nanostructures 103 thereon is contacted to an upper surface of the resist 20, then a predetermined low pressure is applied to the stamp 10 in a direction toward the substrate 5 as shown in FIG. 1B. The nanostructures 103 correspond to a desired shape of the nanostructures Sa to be formed on the substrate 5. Grooves 104 are formed between each element stamp 102 to thereby realize an elementwise embossed stamp 10.

Figure 1C:
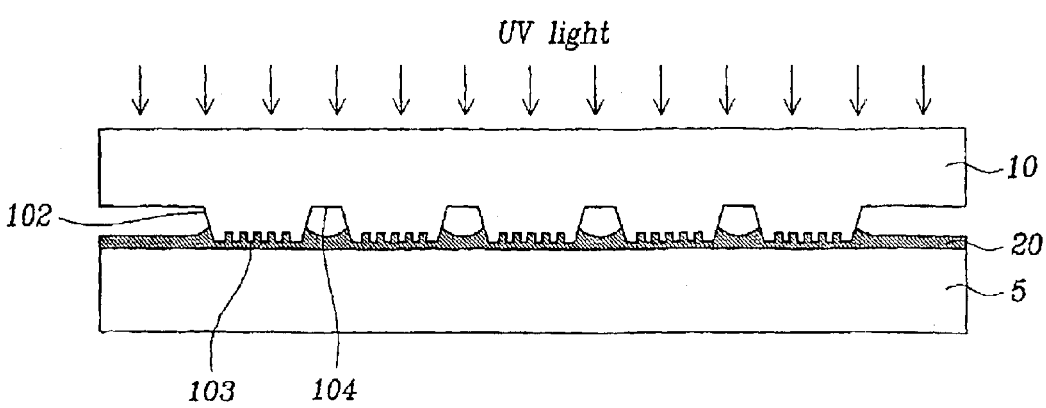

Following the above, ultraviolet rays are irradiated onto the resist 20 through the stamp 10 as shown in FIG. 1C. The elementwise embossed stamp 10 is made of a material that UV rays are able to pass through such that the UV rays reach the resist 20.

Figure 1D:
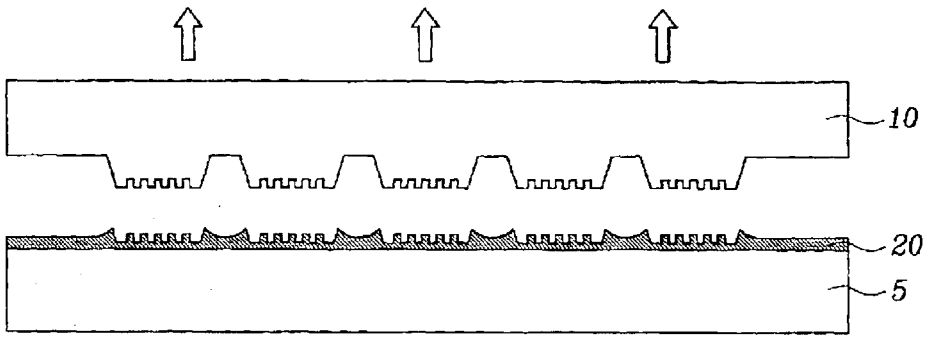
Figure 1E:
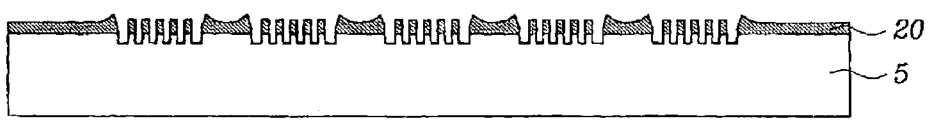
Figure 1F:
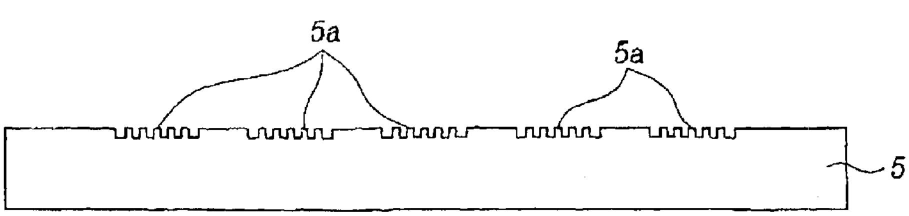

Next, with reference to FIG. 1D, the stamp 10 is separated from the resist 20. Etching of the upper surface of the substrate 5 on which the resist 20 is deposited is then performed to result in the formation as shown in FIG. 1E. The resist 20 is then dry-etched to remove the same, thereby resulting in the formation of the nanostructures 5*a* on the substrate 5 as shown in FIG. 1F.

Figure 2:
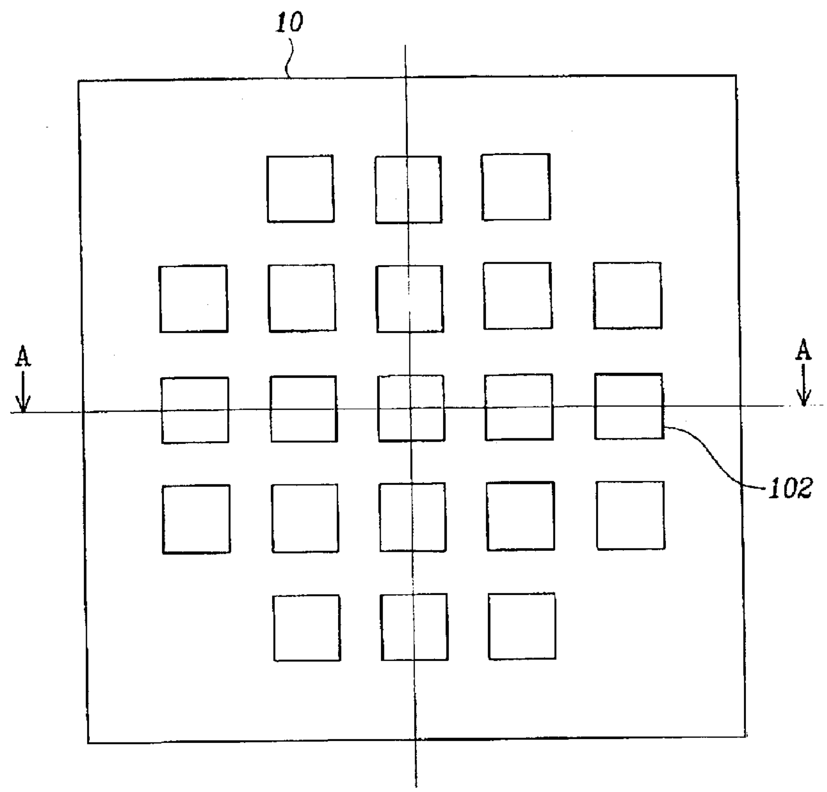
FIG. 2 is a top view of an elementwise embossed stamp according to a first embodiment of the present invention.
Figure 3:
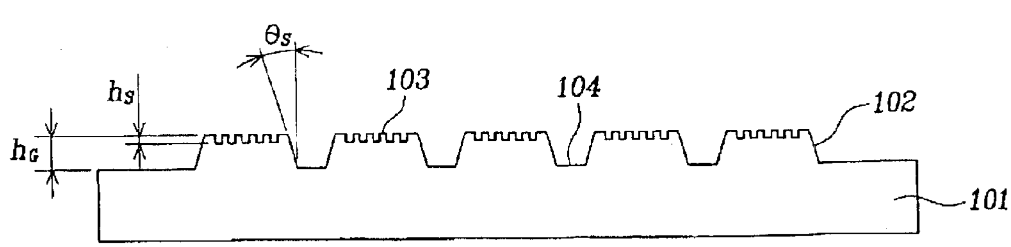
FIG. 3 is a sectional view taken along line A—A of FIG. 2.
Figure 4A:
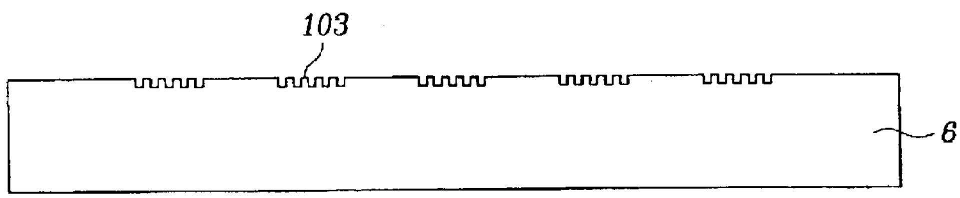
FIGS. 4A to 4D are sectional views used to describe processes for embossing element stamps through the dicing process according to a first embodiment of the present invention.
Figure 4B:
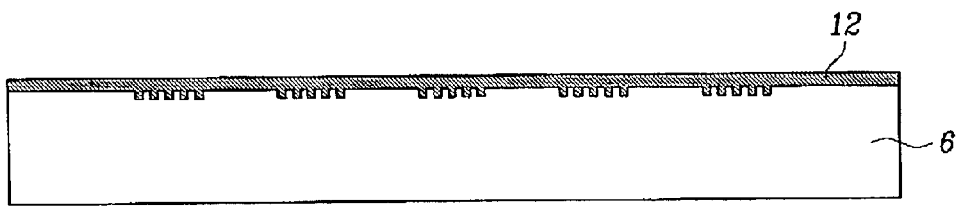
Figure 4C:
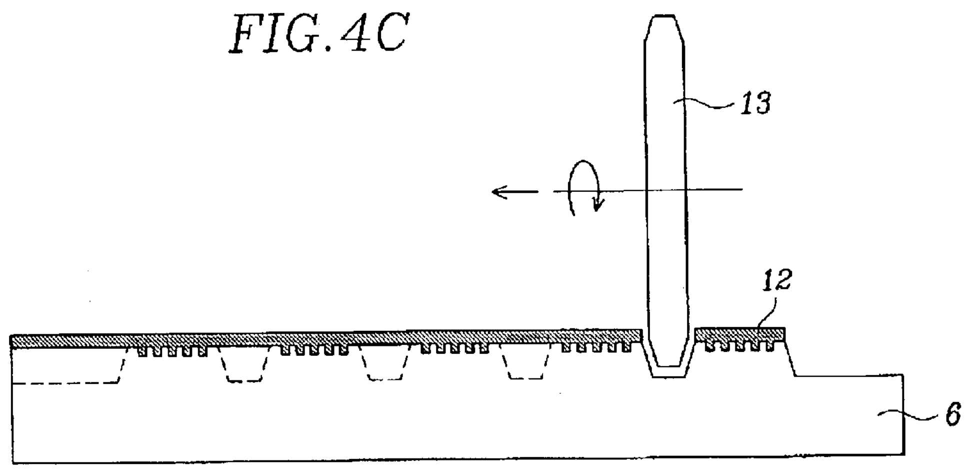
Figure 4D:
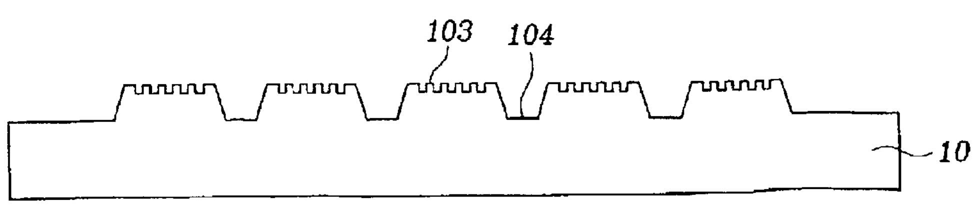
Figure 5A:
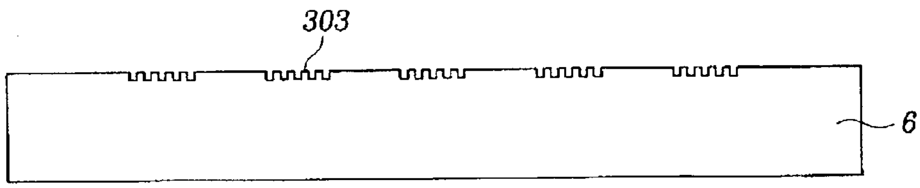
FIGS. 5A to 5D are sectional views used to describe the embossing process of element stamps by etching an elementwise embossed stamp according to a second embodiment of the present invention.
Figure 5B:
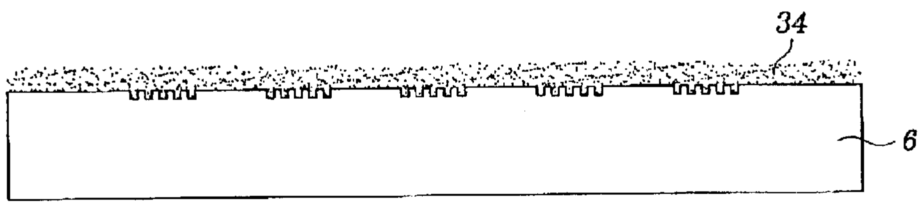
Figure 5C:
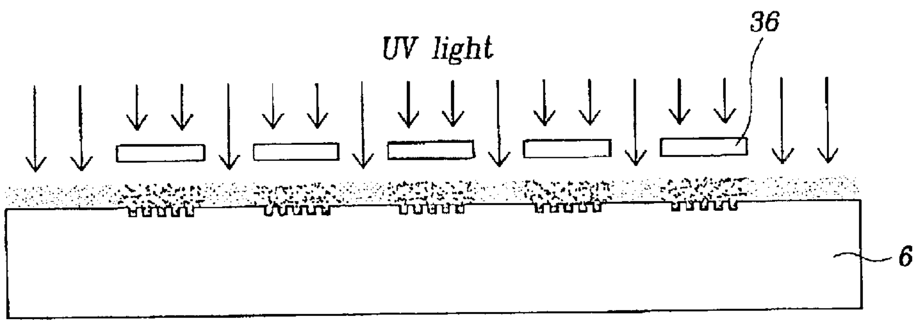
Figure 5D:
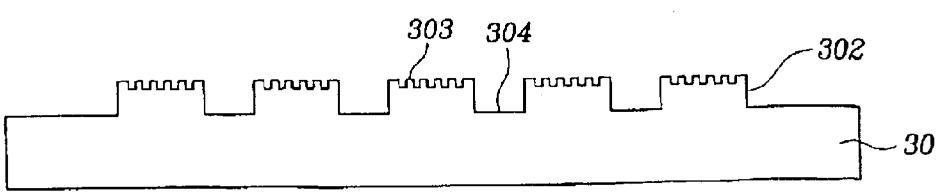

FIG. 2 is a top view of the elementwise embossed stamp 10 according to a first embodiment of the present invention, and FIG. 3 is a sectional view taken along line A—A of FIG. 2.

As shown in FIGS. 2 and 3, the element stamps 102 arranged on the stamp 10 are embossed thereon, and the grooves 104 are formed between adjacent element stamps 102. Further, the nanostructures 103 are formed on each element stamp 102. The nanostructures 103 are formed using a microfabrication process; such as electron-beam lithography.

It is preferable that a depth $h_G$ of the grooves 104 is 2 to 1000 times a depth $h_S$ of the nanostructures 103. If the depth $h_G$ of the grooves 104 is less than 2 times the depth $h_S$ of the nanostructures 103, the minimal difference with the depth $h_S$ of the nanostructures 103 is such that the resist flowing into the grooves 104 reaches bottom surfaces thereof such that the function of the grooves 104 (i.e., receiving all residual resist) is unable to be realized. On the other hand, if the depth $h_G$ of the grooves is greater than 1000 times the depth $h_S$ of the nanostructures 103, the stamp 10 is weakened to such an extent that it may become damaged during nanoimprinting.

Accordingly, the bottom surfaces of the grooves 104 formed between the element stamps 102 do not contact the resist deposited on the substrate or the residual resist during and following nanoimprint lithography.

Further, side walls of the grooves 104 are slanted. If $\theta_S$ is an angle formed between an imaginary line normal to the bottom surfaces and the side walls of the grooves 104, it is preferable that the angle $\theta_S$ is between 0° and 60°. If the angle is less than 0° (i.e., if the angle between the imaginary line normal to the bottom surfaces of the grooves 104 and the side walls of the same is made in a direction toward a center of the grooves 104, the force needed to separate the stamp 10 from the substrate 5 is increased to an unacceptable level. On the other hand, if the angle is greater than 60°, although this separation force is reduced, the spacing between the element stamps 102 becomes greater than required. With this slanting of the side walls of the grooves 104, in addition to reducing the force needed to separate the stamp 10 from the substrate 5, the resist more smoothly flows into the grooves 104 during imprinting.

FIGS. 4A to 4D are sectional views used to describe processes for embossing the element stamps 102 through the dicing process according to a first embodiment of the present invention.

To manufacture the elementwise embossed stamp 10, UV-transmitting materials such as quartz, glass, sapphire, or diamond is formed into a plate 6. Using the microfabrication process such as the electron beam lithography on one side of the plate 6, the nanostructures 103 are engraved into the plate 6 at predetermined intervals, that is, at areas corresponding to where the element stamps 102 are to be formed.

Next, the grooves 104 are formed between the element stamps 102 using the dicing process to thereby form the embossed element stamps 102. To form the grooves 104 using the dicing process, there is used a dicing wheel 13 that has an outer form at a tip portion thereof in the desired shape of the grooves 104. Also, to prevent chips produced during dicing from landing on the nanostructures 103, a protection layer 12 of polymers is coated over the plate 6 and the nanostructures 103. The protection layer 12 is removed from the plate 6 following the dicing process to thereby complete manufacture of the elementwise embossed stamp 10.

In the above processes, it is also possible to form the nanostructures 103 on the element stamps 102 using the electron beam lithography following the formation of the grooves 104 (rather than before the formation of the grooves 104).

FIGS. 5A to 5D are sectional views used to describe processes for embossing element stamps by etching an elementwise embossed stamp according to a second embodiment of the present invention.

To manufacture an elementwise embossed stamp 30 of the second embodiment of the present invention, a UV-transparent material such as quartz, glass, sapphire, or diamond is formed into a plate 6. Using the microfabrication process such the electron beam lithography on one side of the plate 6, nanostructures 303 are carved into the plate 6 at predetermined intervals, that is, at areas corresponding to where element stamps 302 are to be formed.

Next, a UV-curable resin layer 34 is deposited on the stamp 6 covering the nanostructures 303. A mask 36 having a pattern that blocks areas where the element stamps 302 are to be formed and exposes all other areas is placed at a predetermined distance from the surface of the plate 6 on which the nanostructures 303 are formed. UV rays are then irradiated onto the plate 6 such that reactive ion etching is performed on the exposed areas of the plate 6, thereby resulting in the formation of grooves 304 having a quadrilateral cross section and completing the elementwise embossed stamp 30.

Figure 6:
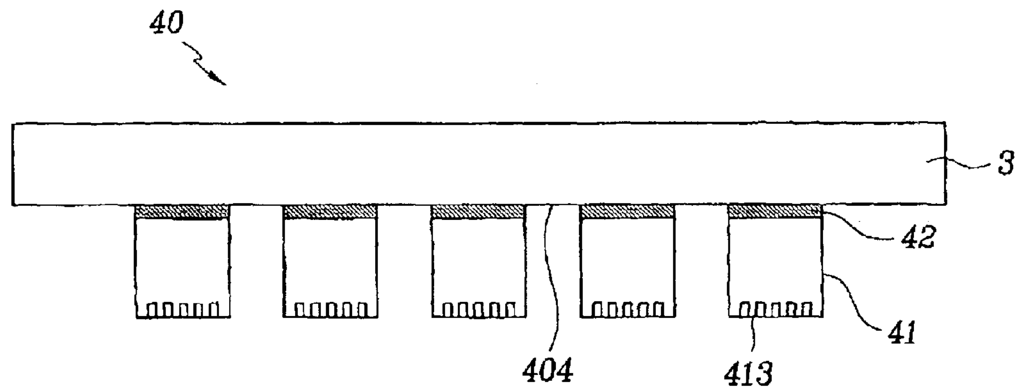
FIG. 6 is a sectional view of an elementwise embossed stamp according to a third embodiment of the present invention.
Figure 7:
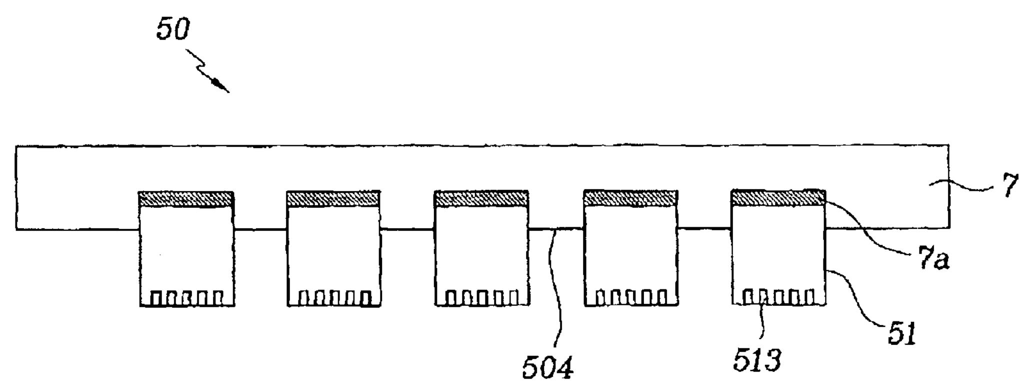
FIG. 7 is a sectional view of an elementwise embossed stamp according to a fourth embodiment of the present invention.
Figure 8:
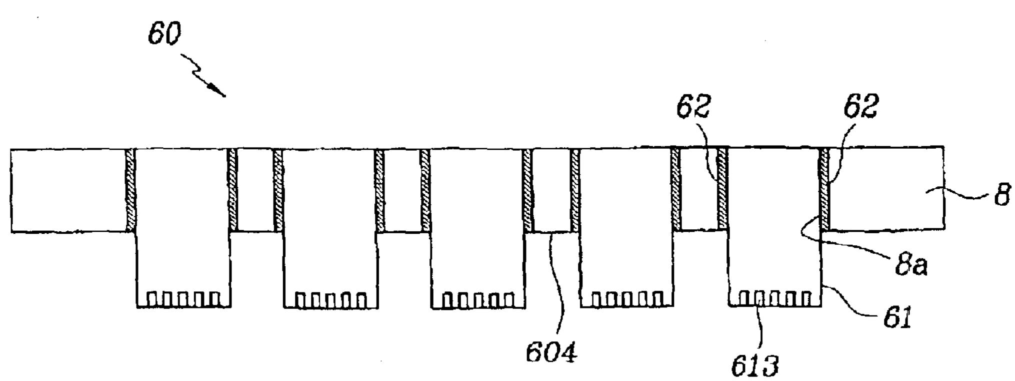
FIG. 8 is a sectional view of an elementwise embossed stamp according to a fifth embodiment of the present invention.

FIGS. 6, 7, and 8 are sectional views of elementwise embossed stamps respectively according to third, fourth, and fifth embodiments of the present invention.

Referring first to FIG. 6, a stamp having formed thereon stamp nanostructures 413 using a process such as the electron beam lithography is cut into the element stamps 41 by a material removal process (e.g., dicing, etching). Next, using spacers to maintain a predetermined gap between the element stamps 41, an adhesive 42 is used to adhere the element stamps 41 to a plate 3 made of UV-transmitting materials such as quartz, glass, sapphire, or diamond to thereby complete an elementwise embossed stamp 40. It is necessary that the adhesive 42 be UV-transmitting. Also, areas between the element stamps 41 act as grooves, as described with reference to the above embodiments.

Referring to FIG. 7, in order to prepare areas for placing prefabricated element stamps 51, shallow grooves 7a are formed in a plate 7. The element stamps 51 are then inserted into the grooves 7*a* to thereby form an elementwise embossed stamp 50.

As shown in FIG. 8, through holes Ba are formed in a plate 8, and pre-fabricated element stamps 61 are inserted into the through holes 8*a* to thereby form an elementwise embossed stamp 60. An adhesive 62 is applied to the through holes 8*a* before insertion of the element stamps 61 such that the element stamps 61 are secured within the through holes 8*a*.

If the adhesive 62 is made of a compound that is eliminated at a predetermined temperature or greater, the element stamps 61 can be individually and selectively replaced. This enables the reduction in stamp manufacturing costs.

Various methods for depositing a polymer resist on a substrate will now be described. The different methods include spin coating, droplet dispensing, and spray methods.

Figure 9A:
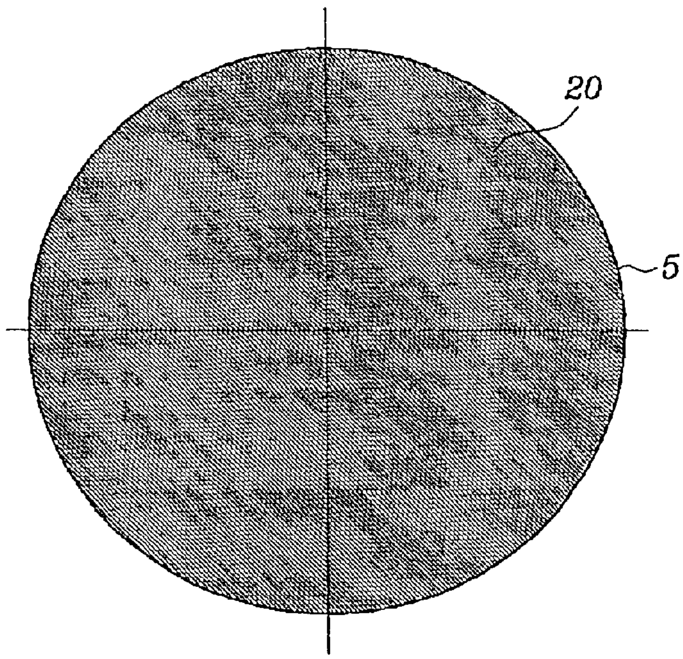
FIGS. 9A and 9B are respectively a top view and a sectional view showing the formation of a resist deposited on a substrate using the spin coating method.
Figure 9B:
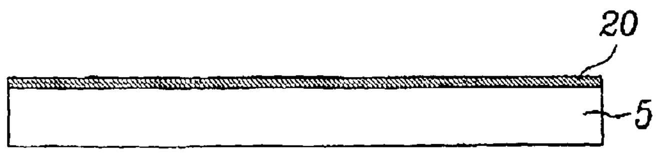
Figure 10A:
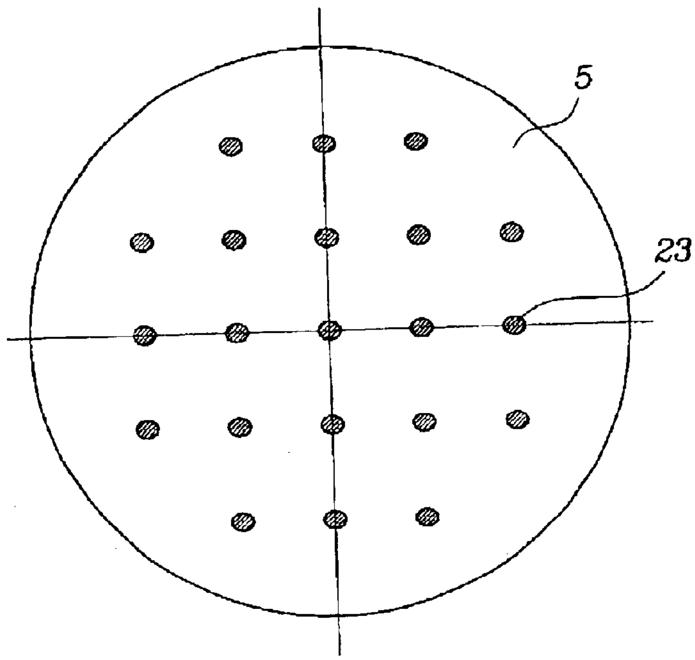
FIGS. 10A and 10B are respectively a top view and a sectional view showing the formation of a resist deposited on a substrate using a droplet dispensing method.
Figure 10B:
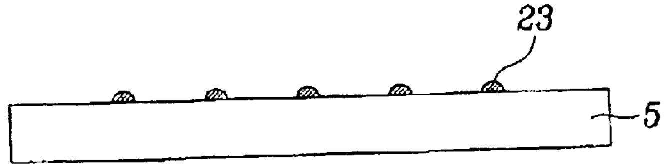

FIGS. 9A and 9B are respectively a top view and a sectional view showing the formation of a resist deposited on a substrate using a spin coating method, and FIGS. 10A and 10B are respectively a top view and a sectional view showing the formation of a resist deposited on a substrate using a droplet dispensing method.

As shown in FIGS. 9A and 9B, using the spin coating method, the resist 20 is deposited on the substrate 5 at a uniform thickness. As shown in FIGS. and 10B, in the droplet dispensing method, a single nozzle or multiple nozzles are used to dispense resist droplets 23 on the substrate 5 at geometric centers of where each element stamp will be formed.

Figure 11A:
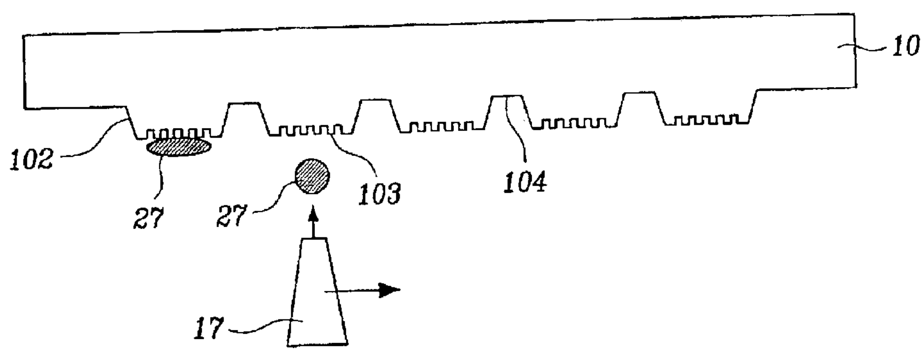
FIGS. 11A and 11B are sectional views respectively showing the dispensing of resist droplets directly on an elementwise embossed stamp and the deposition of the resist on a substrate according to an embodiment of the present invention.
Figure 11B:
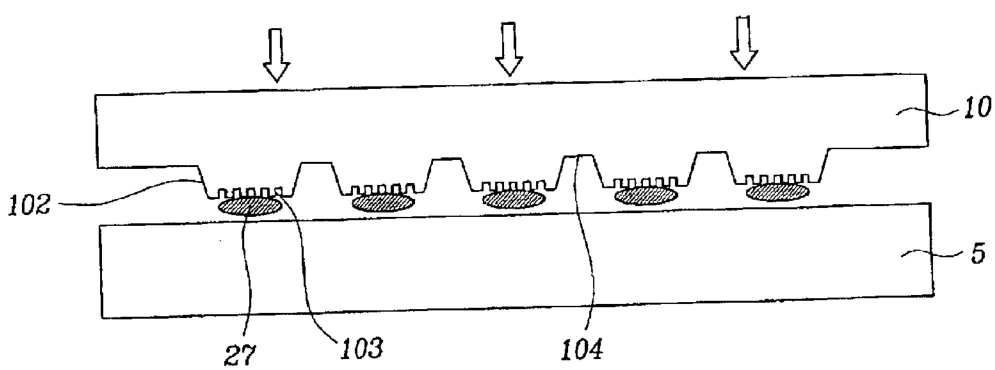

Referring to FIGS. 11A and 11B, one or multiple nozzles 17 are used to directly deposit resist droplets 27 on each element stamp 102. The elementwise embossed stamp 10 with the resist droplets 27 deposited thereon in this manner is then contacted to the upper surface of the substrate 5 and applied with a low pressure, after which UV nanoimprint lithography is performed.

Figure 12A:
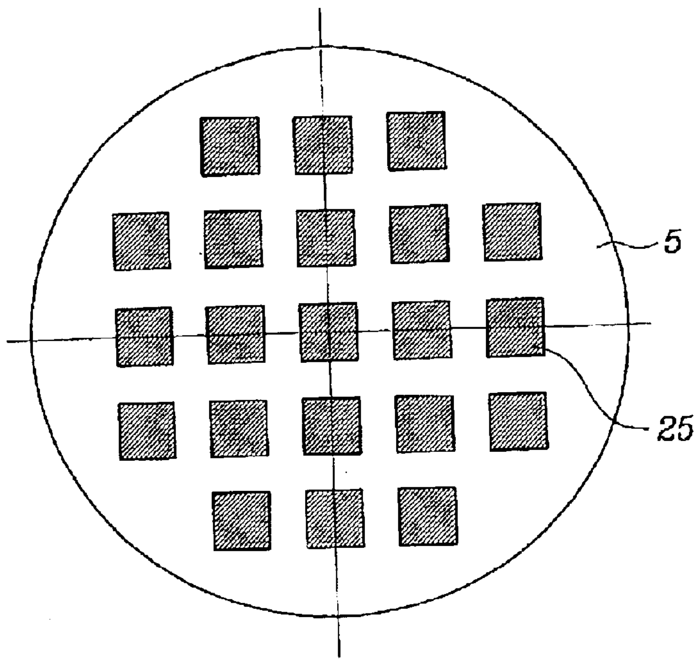
FIGS. 12A and 12B are respectively a top view and a sectional view showing the formation of a resist on a substrate deposited thereon through a spray method using a mask according to an embodiment of the present invention.
Figure 12B:
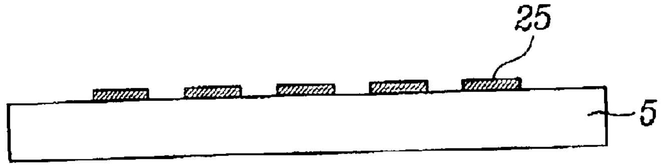
Figure 13A:
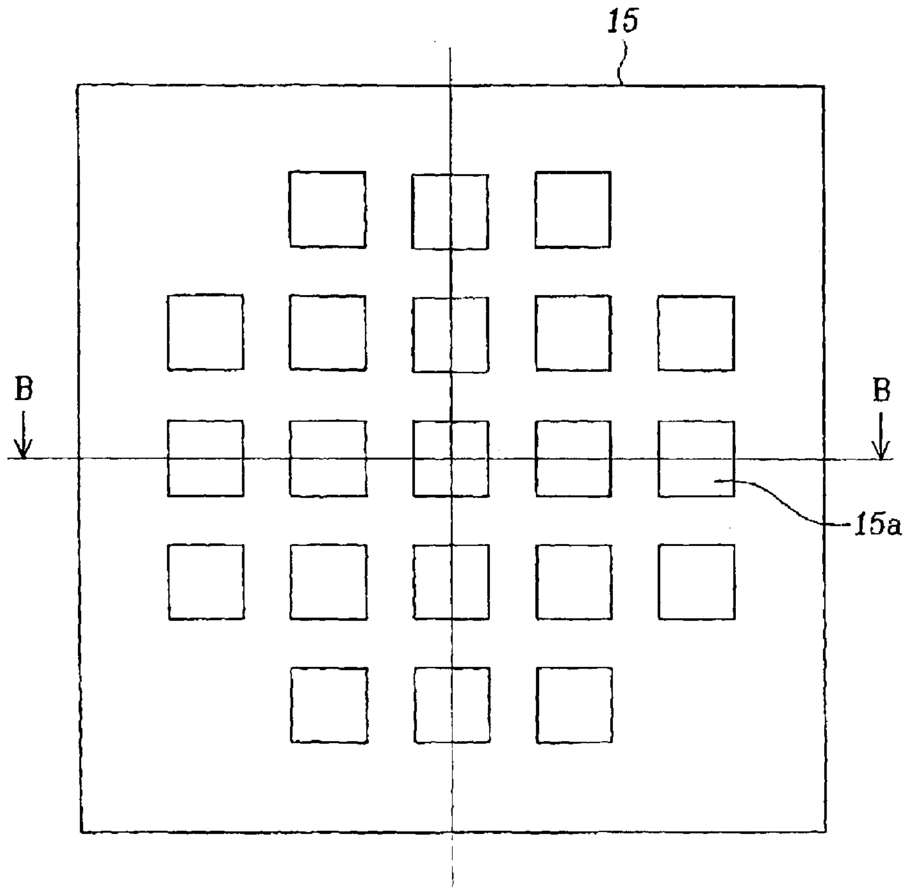
FIG. 13A is a top view of a mask used in a spray method for the deposition of a resist according to an embodiment of the present invention.
Figure 13B:
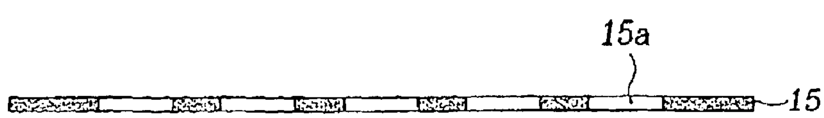
FIG. 13B is a sectional view taken along line B—B of FIG. 13A.
Figure 14A:
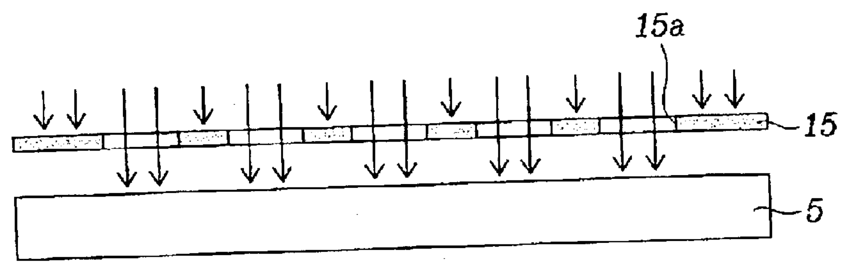
FIGS. 14A and 14B are sectional views used to describe a spray method that uses a mask according to an embodiment of the present invention.
Figure 14B:
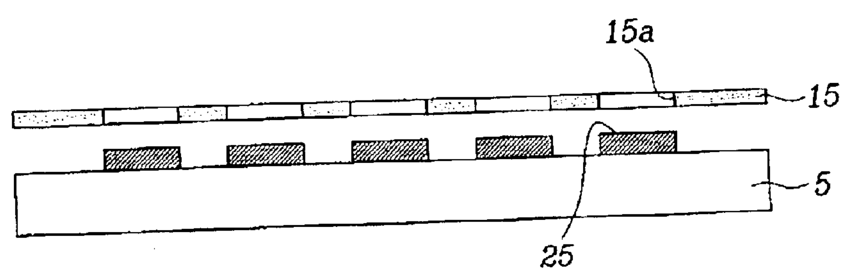

For the spray method, mask spraying or nozzle spraying can be performed. FIGS. 12A and 12B are respectively a top view and a sectional view showing the formation of a resist on a substrate deposited thereon through a spray method using a mask according to an embodiment of the present invention. FIG. 13A is a top view of a mask used in a spray method for the deposition of a resist according to an embodiment of the present invention, and FIG. 13B is a sectional view taken along line B—B of FIG. 13A. FIGS. 14A and 14B are sectional views used to describe a spray method that uses a mask according to an embodiment of the present invention.

In the mask spray method, a mask 15 having openings 15*a* in the shape of a cross section of element stamps to be formed is manufactured as shown in FIGS. 13A and 13B. The mask 15 is then provided above the substrate 5 with a predetermined gap therebetween, and a resist is sprayed onto the mask 15 using one or multiple nozzles 17. As shown in FIGS. 12A and 12B, a resist 25 deposited on the substrate 5 is formed in the shape of the holes 15*a* of the mask 15, that is, in the shape of the cross section of the element stamps to be formed.

In the nozzle spray method, one or multiple nozzles are used to selectively deposit a resist on a substrate in the form of a cross sectional shape of the element stamps. In the case where a resist is deposited using the nozzle spray method, a more uniform thickness of the deposited resist results compared to when depositing droplets.

By varying the shape of the holes 15*a* of the mask 15, various shapes of the resist 25 can result on the substrate 5 (e.g., circular, multiple drops).

Figure 15A:
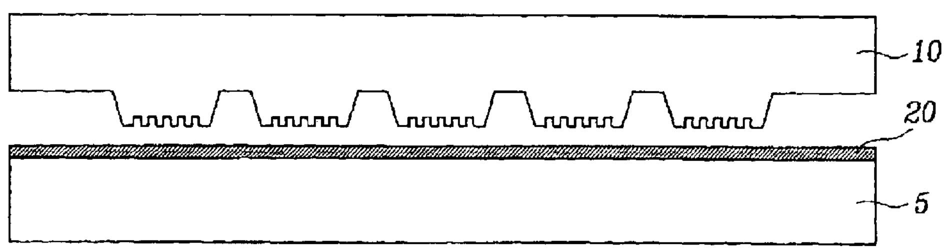
FIGS. 15A and 15B are sectional views used to describe the flow of residual resist into grooves in the case where an elementwise embossed stamp is used to perform nanoimprinting on a spin-coated substrate according to an embodiment of the present invention.
Figure 15B:
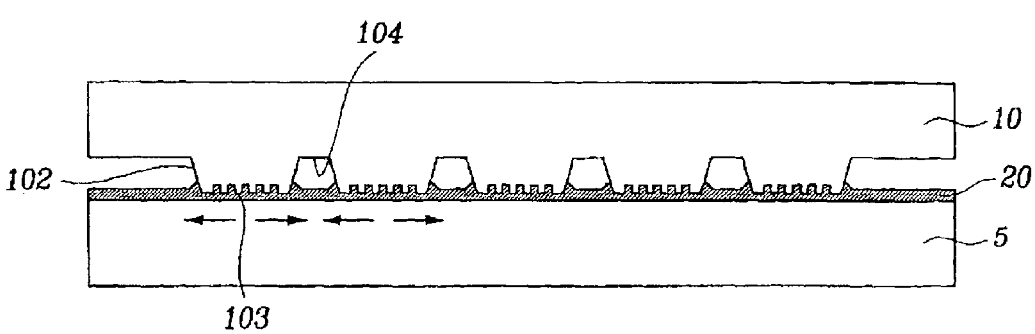
Figure 16A:
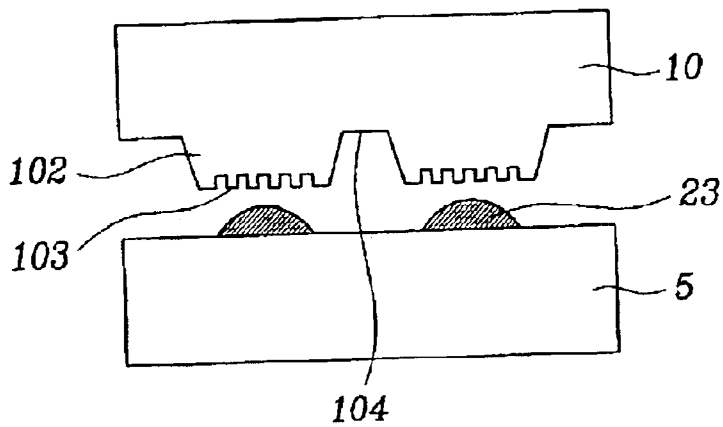
FIGS. 16A and 16B are sectional views used to describe the flow of residual resist into grooves in-the case where an elementwise embossed stamp is used to perform nanoimprinting on a substrate to which resist droplets are selectively dispensed thereon according to an embodiment of the present, invention.
Figure 16B:
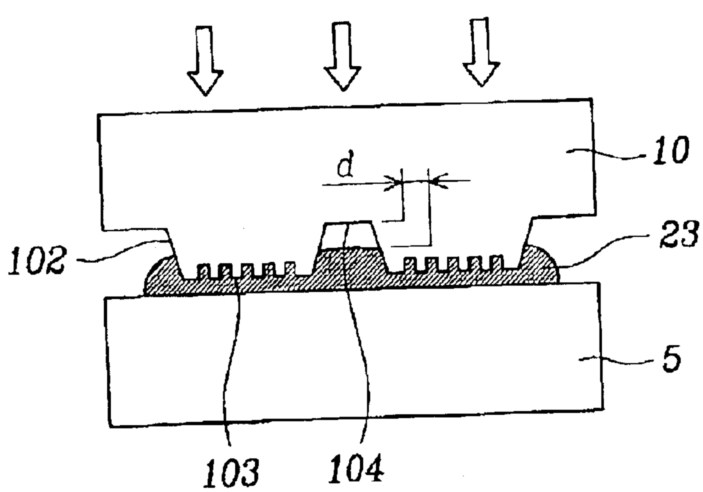
Figure 17A:
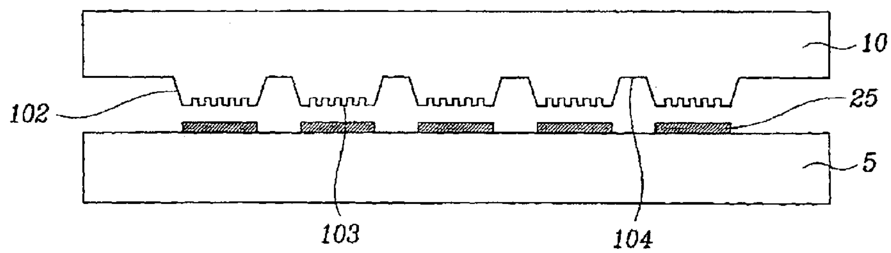
FIGS. 17A and 17B are sectional views used to describe the flow of residual resist into grooves in the case where an elementwise embossed stamp is used to perform nanoimprinting on a substrate deposited with a resist using a spray method according to an embodiment of the present invention.
Figure 17B:
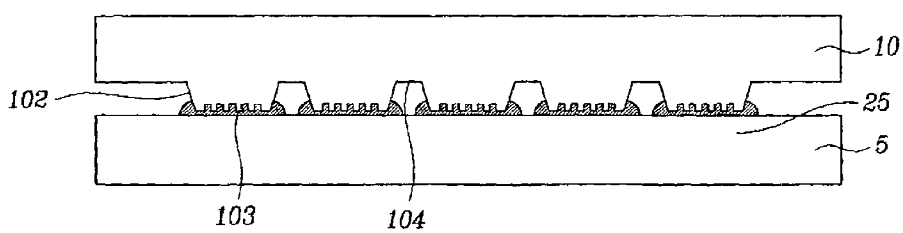

FIGS. 15A and 15B are sectional views used to describe the flow of residual resist into grooves in the case where an elementwise embossed stamp is used to perform nanoimprinting on a spin-coated substrate according to an embodiment of the present invention, FIGS. 16A and 16B are sectional views used to describe the flow of residual resist into grooves in the case where an elementwise embossed stamp is used to perform nanoimprinting on a substrate to which resist droplets are selectively deposited thereon according to an embodiment of the present invention, and FIGS. 17A and 17B are sectional views used to describe the flow of residual resist into grooves in the case where an elementwise embossed stamp is used to perform nanoimprinting on a substrate deposited with a resist using a spray method according to an embodiment of the present invention.

In each of the cases illustrated in these drawings, the resists 20, 23, and 25 that are compressed by the element stamps 102 spread outward from a center of the element stamps 102, and, at the same time, the resists 20, 23, and 25 flow into the grooves 104 formed between the element stamps 102. Since a relatively large amount of the residual resist 20, 23, and 25 flows into the grooves 104 formed between the embossed stamps 102, insufficient filling occurring by differences in heights at different areas of the deposited resists 20, 23, and 25, and insufficient filling occurring by differences in flatness between the substrate 5 and the elementwise embossed stamp 10 can be minimized. After completing the processes, spaces of a distance d exist between the resists 20, 23, and 25, and the element stamps 102. This allows for a reduction in the force needed to separate the elementwise embossed stamp 10 from the substrate 5.

Figure 18:
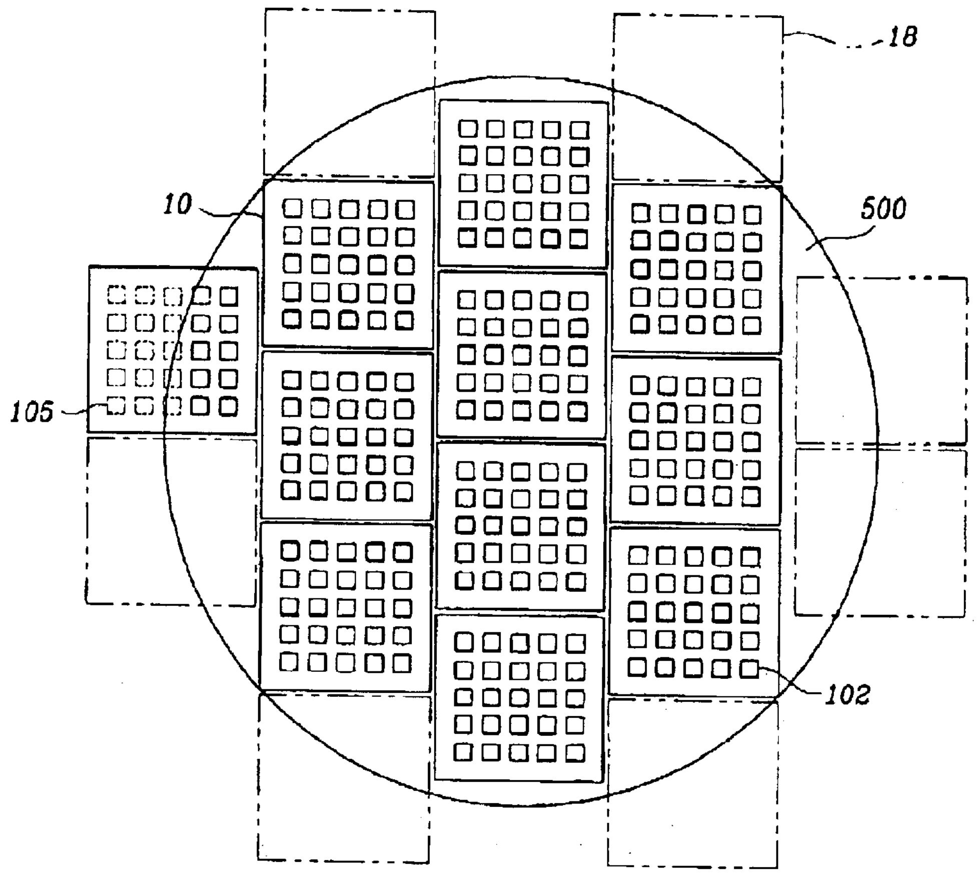
FIG. 18 is a schematic view used to describe a technique for performing nanoimprinting on a large substrate using an elementwise embossed stamp, that is, selectively using element stamps on edges of the substrate to maximize the utilization of a large substrate according to an embodiment of the present invention.
Figure 19A:
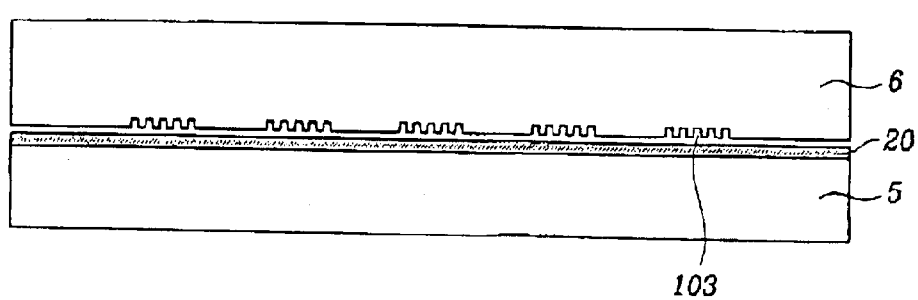
FIGS. 19A and 19B are sectional views used to describe movement of residual resist in the case where nanoimprinting of a resist is performed on a spin-coated substrate using a conventional flat stamp.
Figure 19B:
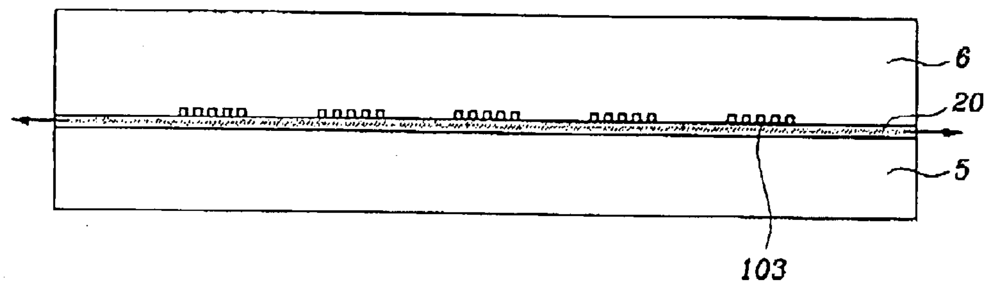

FIG. 18 is a schematic view used to describe a technique for performing nanoimprinting on a large substrate using an elementwise embossed stamp, that is, selectively using element stamps on edges of the substrate to maximize utilization of a large substrate according to an embodiment of the present invention.

When using the elementwise embossed stamp 10 of the present invention to perform UV nanoimprint lithography on a large substrate 500, that is, on a large substrate 500 having an area that is greater than an area of the elementwise embossed stamp 10, it is possible to repeat the UV nanoimprint lithography processes several times. Since edge areas of the substrate 500 may be effectively imprinted by selectively using the element stamps 102 formed on the elementwise embossed stamp 10, utilization of the substrate 500 may be maximized.

In more detail, as shown in FIG. 18, when imprinting the edge portions of the substrate 500, among the element stamps of the elementwise embossed stamps 18, imprinting is performed to form nanostructures only with respect to the element stamps 102 included in the substrate 500 (shown by the solid lines), whereas the element stamps 105 outside of the substrate 500 are not used (shown by the dotted lines).

In the UV nanoimprint lithography using the elementwise embossed stamps of the present invention described above, the grooves formed between the element stamps allow the embossed element stamps to independently perform UV nanoimprint lithography, and ensure that the nanostructures carved into the element stamps are completely filled. Further, since the area of each of the element stamps is sufficiently small, there is only an extremely small possibility of impurities existing between the embossed element stamps and the resist. Finally, with the flow of the residual resist into the grooves, only minimal forces are required for nanoimprinting and to separate the stamp from the substrate following nanoimprinting.

Figure 20:
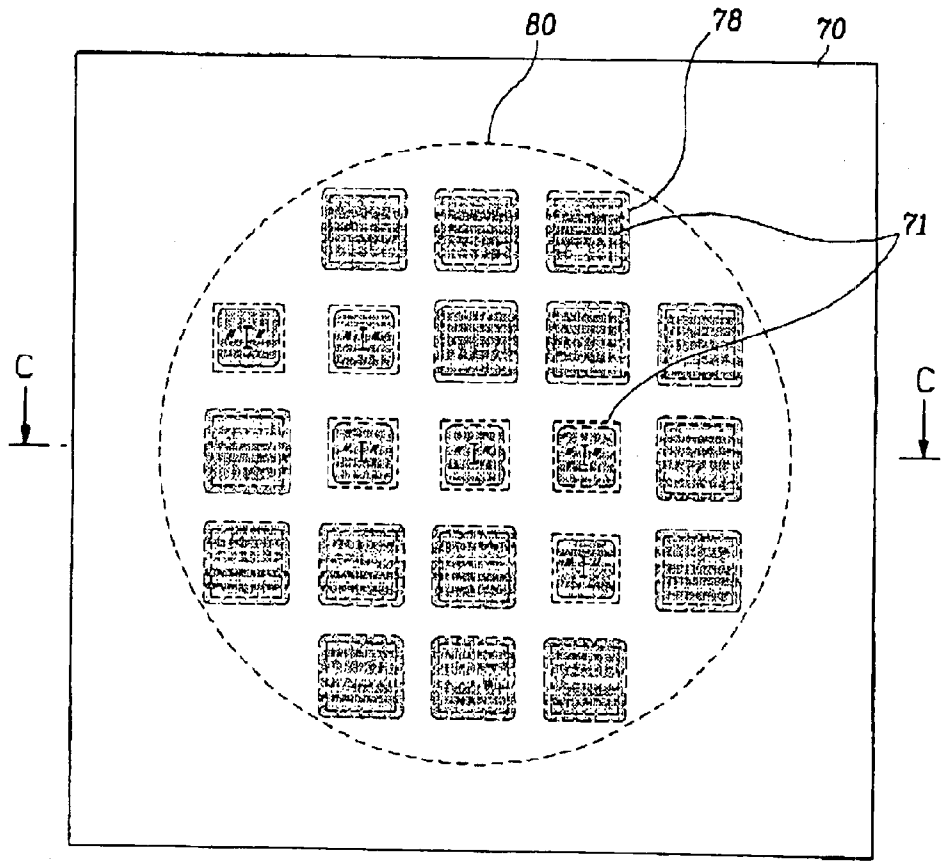
FIG. 20 is a top view used to show incompletely pressed resist areas when resist droplets are dispensed on a substrate using a multi-dispensing method, and an elementwise embossed stamp is used to apply a first pressure in a UV nanoimprint lithography process according to an embodiment of the present invention.
Figure 21A:
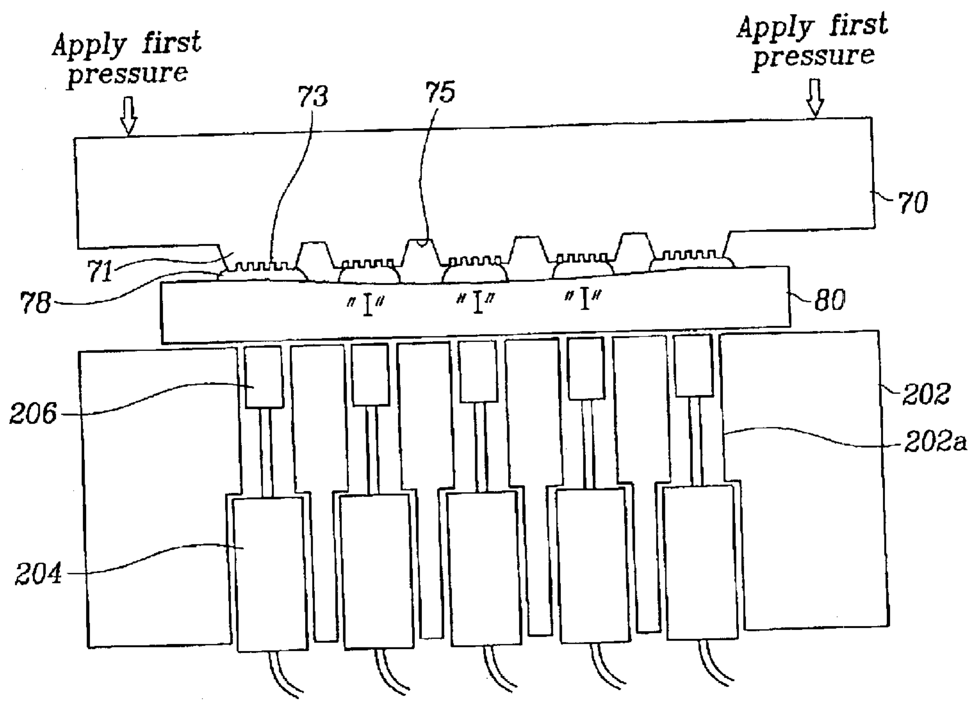
FIGS. 21A and 21B are sectional views used to describe the sequential application of a first pressure to resist droplets using an elementwise embossed stamp, and the application of a second pressure to the backside of a substrate using a piezoelectric actuator in a UV nanoimprint lithography process according to a sixth embodiment of the present invention.
Figure 21B:
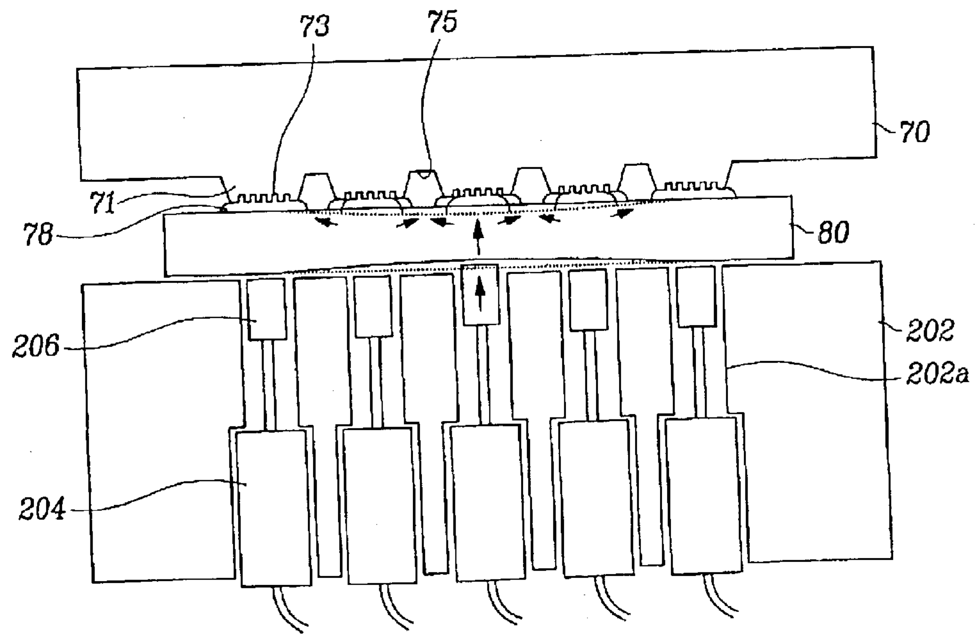

FIG. 20 is a top view used to show incompletely compressed resist areas when resist droplets are dispensed on a substrate using a multi-dispensing method, and an elementwise embossed stamp is used to apply a first pressure in a UV nanoimprint lithography process according to an embodiment of the present invention. FIGS. 21A and 21B are sectional views used to describe the sequential application of a first pressure to resist droplets using an elementwise embossed stamp, and the application of a second pressure to the backside of a substrate using a pressure element device in a UV nanoimprint lithography process according to a sixth embodiment of the present invention. FIGS. 21A and 21B are sectional views taken along line C—C of FIG. 20.

In order to form nanostructures on a substrate 80, a resist 78 is first deposited on the substrate 80. The resist 78 may be deposited on the substrate 80 using a spin coating method that evenly coats the resist 78 over an entire surface of the substrate 80, a droplet dispensing method that deposits resist droplets on the substrate 80 at areas where nanostructures will be formed, or a spray method, in which a mask having openings corresponding to element stamps 71 of an elementwise embossed stamp 70 is positioned over the substrate 80, after which a resist is sprayed onto the mask. In the droplet dispensing method, the resist droplets may be directly deposited on the element stamps 71 of the elementwise embossed stamp 70.

The case where the droplet dispensing method is used to dispense resist droplets 78 on the substrate 80 will be used as an example to describe the processes of the present invention.

The stamp 70 on which stamp nanostructures 73 are formed in a configuration corresponding to nanostructures to be formed on the substrate 80 is contacted to the resist droplets 78. A predetermined low pressure is then applied by the stamp 70 in a direction toward the substrate 80. Used for the stamp 70 is an elementwise embossed stamp having grooves 75 formed between the element stamps 71. The grooves 75 have a depth greater than a depth of the nanostructures 73 formed on the element stamps 71. Further, the stamp 70 is made of a material that is UV-transmitting such as quartz, glass, sapphire, and diamond. In addition, the stamp 70 is plate-shaped and the nanostructures 73 on each of the element stamps 71 are formed through the microfabrication process.

Subsequently, detection of insufficiently compressed resist areas ('I' in the drawings) is performed. In this embodiment of the present invention, in a state where a pressure is applied to the resist droplets 78 by the elementwise embossed stamp 70, areas of the pressed resist droplets 78 that are less spread out than areas of the nanostructures 73 carved in the element stamps 71 ('I' in the drawings) are detected from above the stamp 70 using an optical measuring device (not shown) such as a CCD (charged couple device). This is made possible by the elementwise embossed stamp 70 being made of a UV-transmitting material to thereby allow detection of the resist droplets 78, which are under the stamp 70, by an optical measuring device.

Following the above, supplementary pressure is selectively applied to areas of the resist that are insufficiently non-uniformly pressed. The selective supplementary pressure may be applied to the backside of the substrate 80, or can be applied to an upper surface of the stamp 70. In this embodiment of the present invention, with reference to FIG. 21B, holes 202*a* are formed in a substrate table 202 on which the substrate 80 is placed, and supplementary pressure devices such as piezoelectric actuators 204 are mounted within the holes 202*a* to apply the supplementary pressure to the backside of the substrate 80. Each of the piezoelectric actuators 204 includes a plunger 206, which has a flat contact surface for surface contact with the backside of the substrate 80.

The above supplementary pressure devices can be mounted in various configurations as needed. That is, one device may be mounted at an area corresponding to a center of the substrate 80, or three devices may be mounted at 120° intervals about a mutual center point. Also, the supplementary pressure devices may be mounted at locations corresponding to the positioning of the nanostructures 73 of the stamp, i.e., corresponding to a number and positions of the element stamps 71.

In the sensing of resist areas that are insufficiently or non-uniformly imprinted, the optical measuring device measures projected areas in a vertical direction of the resist droplets to which pressure is applied by the nanostructures 73 or the element stamps 71. If the measured areas of the resist droplets 78 are smaller than the areas of the nanostructures 73 or distal end areas of the element stamps 71, the corresponding or closest supplementary pressure devices such as the piezoelectric actuators 204 are operated to increase the projected area of the resist droplets. The increased areas of the resist droplets 78 are then again measured and compared to the corresponding sectional area of nanostructures 73 or the element stamps 71. If this second measurement reveals that the areas of the resist droplets 78 are larger than the areas of the stamp nanostructures 73 or the distal end areas of the element stamps 71, the subsequent step is performed, while the process is repeated if this condition is not satisfied.

On the other hand, if a resist is spin-coated on the substrate 80, the optical measuring device is used in a state where the resist is coated on the stamp to measure thicknesses of resist layers positioned under the nanostructures of the stamp. That is, by comparing the thicknesses, the supplementary pressure devices corresponding to areas of the relatively thick resist layers (or closest to these areas) are operated.

Pneumatic actuators that utilize compressed air may be used as the supplementary pressure devices. In this case, rather than selectively applying supplementary pressure after measuring a thickness or degree of spreading of the pressed resist, the air pressure devices mounted on the backside of the substrate apply pressure so a uniform level of pressure is maintained following application of the first pressure such that a supplementary pressure is applied to areas of the resist receiving application of an insufficient pressure, which occurs at areas where there are large differences in flatness between the substrate and the stamp. That is, at areas where there are large differences in flatness, a relatively small pressure is applied during application of the first pressure such that the supplementary pressure operates at these areas by the air pressure devices. With this method, a device to measure the thickness and degree of spreading of the resist is unneeded.

In addition, it is possible to apply pressure to the entire backside of the substrate using high pressure gas (e.g., nitrogen). A measuring device is also unneeded in this case. With the application of a supplementary pressure using high pressure gas, a relatively large pressure is applied to areas where there are large differences in flatness between the substrate and the stamp to thereby realize the selective application of the supplementary pressure.

Next, UV rays are irradiated onto the resist 78. Since the elementwise embossed stamp 70 is made of a material that allows the transmission of UV rays therethrough, the UV rays reach the resist 78.

The elementwise embossed stamp 70 is then separated from the resist 78, after which the upper surface of the substrate 80 on which the resist 78 is deposited is etched. Finally, by stripping the resist 78 remaining on the substrate 80, nanostructures formed on the substrate 80 through this process are exposed.

Figure 22:
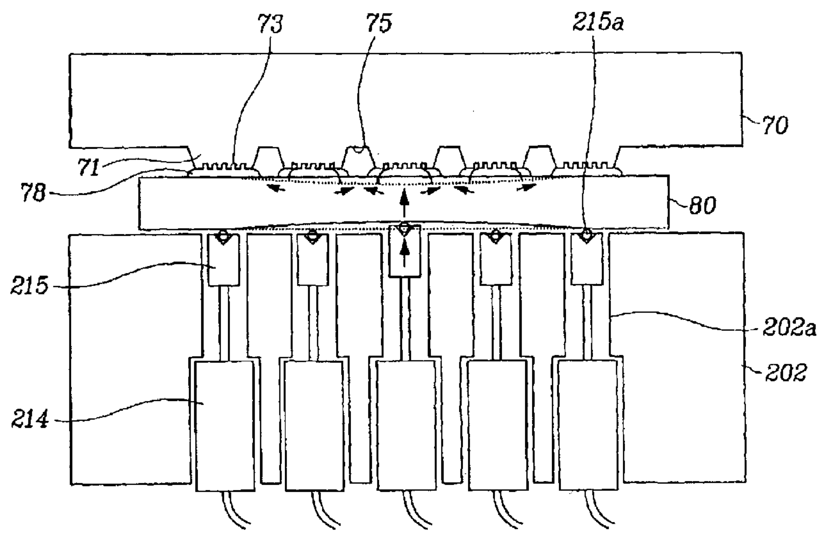
FIG. 22 is a sectional view used to describe the application of a supplemental pressure using a pressure element device including a plunger that provides a point contact to the backside of a substrate in a UV nanoimprint lithography process according to a seventh embodiment of the present invention.

FIG. 22 is a sectional view used to describe the application of a supplemental pressure using a pressure element device including a plunger that provides a point contact to the backside of a substrate in a UV nanoimprint lithography process according to a seventh embodiment of the present invention. Elements identical to those appearing in the sixth embodiment will be indicated using the same reference numerals.

In this embodiment, supplementary pressure devices used to selectively apply a supplementary pressure to areas of a resist that are insufficiently or non-uniformly imprinted are piezoelectric actuators 214. The piezoelectric actuators 214 each include a plunger 215 having a spherical tip 215*a*. Other aspects of the seventh embodiment are identical to the sixth embodiment.

Figure 23:
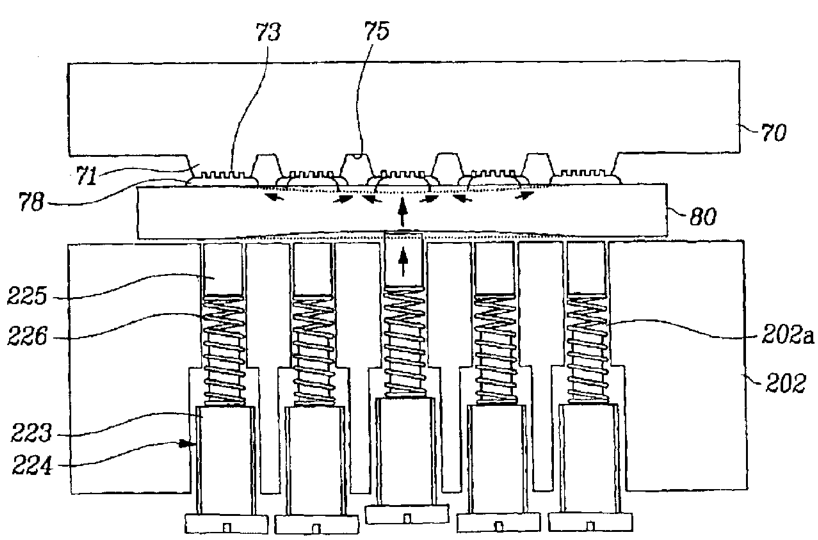
FIG. 23 is a sectional view used to describe the application of a supplemental pressure using spring-screw mechanism units in a UV nanoimprint lithography process according to an eighth embodiment of the present invention.

FIG. 23 is a sectional view used to describe the application of a supplemental pressure using a spring-screw mechanism in a UV nanoimprint lithography process according to an eighth embodiment of the present invention. Elements identical to those appearing in the sixth embodiment will be indicated using the same reference numerals.

In the eighth embodiment, supplementary pressure devices used in the process of selectively applying supplementary pressure to areas of a resist that are insufficiently or non-uniformly imprinted are spring-screw mechanism units 224. The spring-screw mechanism units 224 each includes a compression spring 226 and a screw driving element 223. For each of the spring-screw mechanism units 224, displacement resulting from operation of the screw driving element 223 varies the amount of compression of the compression spring 226 to thereby fine-control an absolute displacement of the substrate 80 and allow minute adjustments of displacement. Supplementary pressure, therefore, is applied to the backside of the substrate 80. An elastic member made of rubber or another such material can be used in place of the compression springs 226. A plunger 225 of each of the spring-screw mechanism units 224 has a flat contact surface for surface contact with the backside of the substrate 80. However, a spherical tip may be used for point contact as in the second embodiment. Other aspects of the eighth embodiment are identical to the sixth embodiment.

Figure 24A:
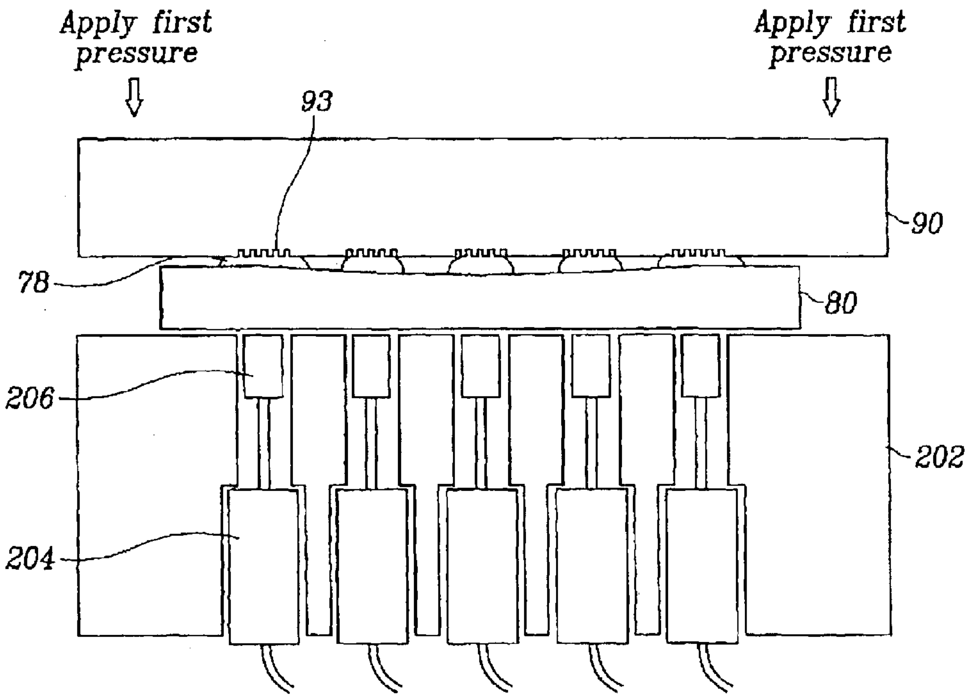
FIGS. 24A and 24B are sectional views used to describe the sequential application of a first pressure to resist droplets using a flat stamp, and the selective application of a second pressure to the backside of a substrate using a pressure element device in a UV nanoimprint lithography process according to a ninth embodiment of the present invention.
Figure 24B:
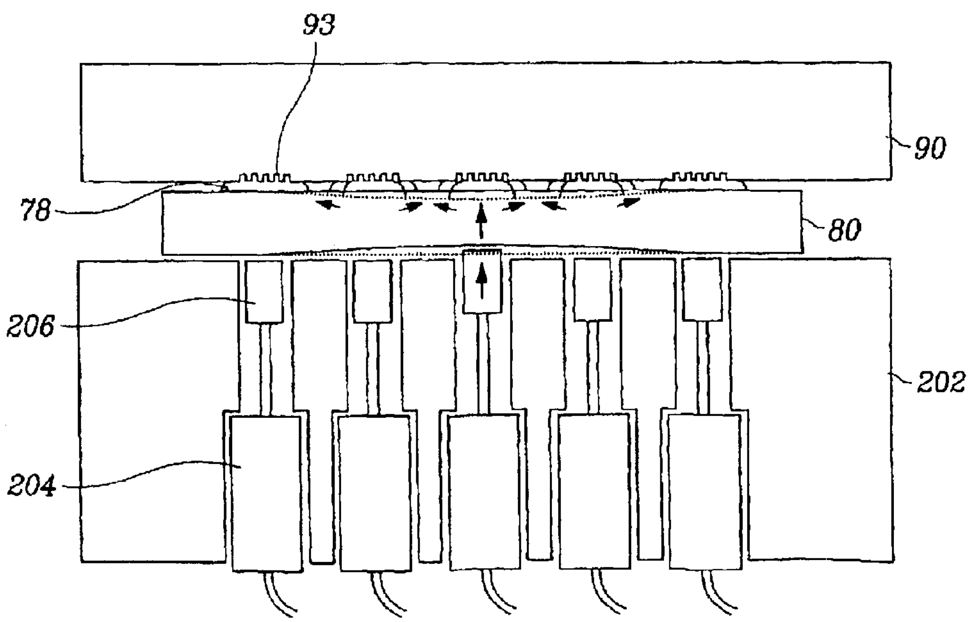

FIGS. 24A and 24B are sectional views used to describe the sequential application of a first pressure to resist droplets using a flat stamp, and the selective application of a second pressure to the backside of a substrate using a pressure element device in a UV nanoimprint lithography process according to a ninth embodiment of the present invention. Elements identical to those appearing in the sixth embodiment will be indicated using the same reference numerals.

In the ninth embodiment, a flat stamp 80 is used to form nanostructures on a substrate 80. As shown in the drawings, the flat stamp 80 with nanostructures 93 formed thereon is contacted to an upper surface of the resist droplets 78 deposited on the substrate 80, then a predetermined low pressure is applied at room temperature. After areas of the resist insufficiently or non-uniformly imprinted are sensed, the piezoelectric actuators 204 are operated to apply a supplementary pressure to these areas. Other aspects of the ninth embodiment are identical to the sixth embodiment.

Figure 25A:
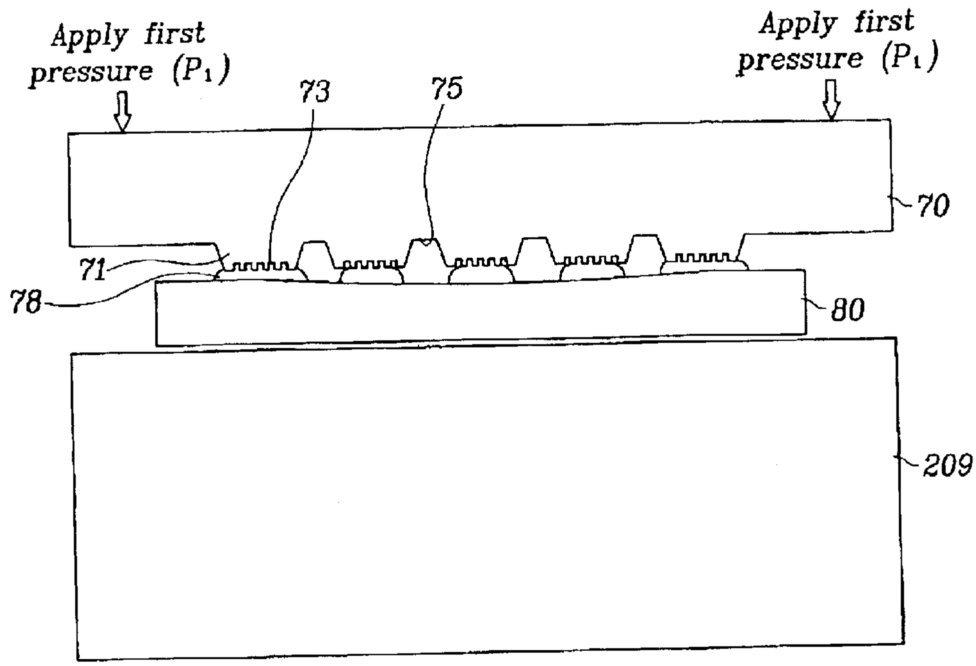
FIGS. 25A and 25B are sectional views used to describe the sequential application of a first pressure to resist droplets using an elementwise embossed stamp, and the selective application of a second pressure to an upper surface of the stamp in a UV nanoimprint lithography process according to a tenth embodiment of the present invention.
Figure 25B:
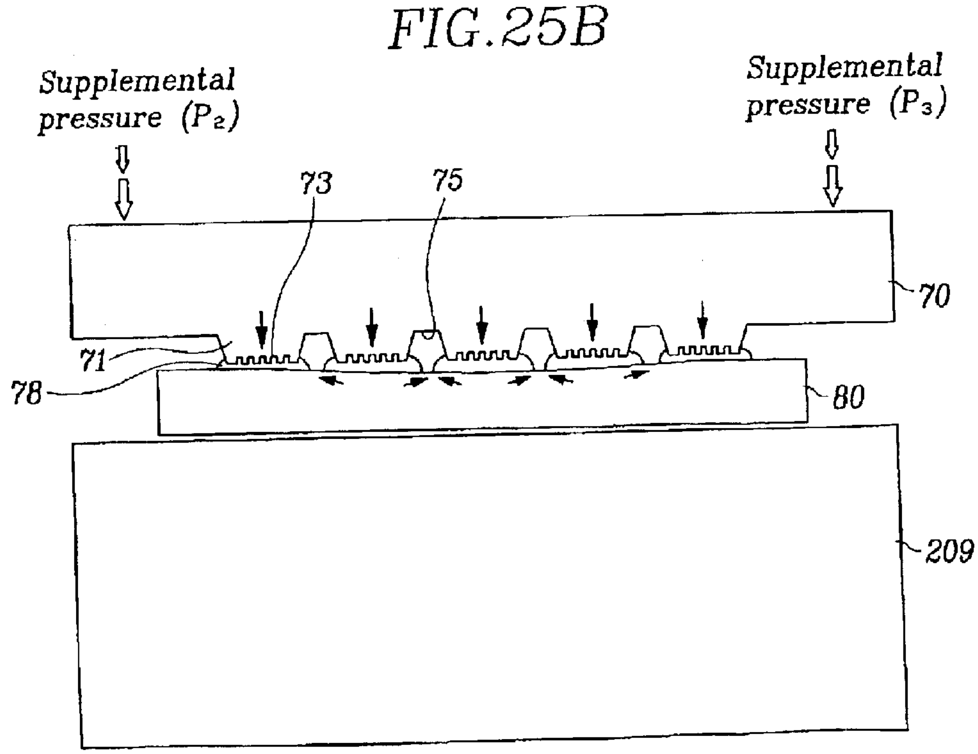

FIGS. 25A and 25B are sectional views used to describe the sequential application of a first pressure to resist droplets using an elementwise embossed stamp, and the selective application of a second pressure to an upper surface of the stamp in a UV nanoimprint lithography process according to a tenth embodiment of the present invention. Elements identical to those appearing in the sixth embodiment will be indicated using the same reference numerals.

In the tenth embodiment, the elementwise embossed stamp 70 is contacted to the upper surfaces of the resist droplets 78 deposited on the substrate 80, then a predetermined low pressure P1 is applied to the stamp 70 in a direction toward the substrate 80. Next, areas of the resist insufficiently or non-uniformly imprinted are sensed, and supplementary pressures (e.g., P2 and P3) are applied from the four corner areas to the stamp 70 in a direction toward the substrate 80 in order to further compress these areas of the resist insufficiently or non-uniformly imprinted.

That is, supplementary pressure devices (not shown) are mounted on each corner area of the elementwise embossed stamp 70 to selectively apply supplementary pressure when insufficiently or non-uniformly imprinted areas of the resist are sensed. The amount of pressure applied by each of the supplementary pressure devices may be varied as needed. Further, the elementwise embossed stamp 70 is made of material that can sufficiently withstand the forces applied by the supplementary pressure devices. The substrate 80 is provided on a substrate table 209. Although the tenth embodiment was explained using the elementwise embossed stamp 70, it is also possible to use a flat stamp as in the ninth embodiment.

Figure 26:
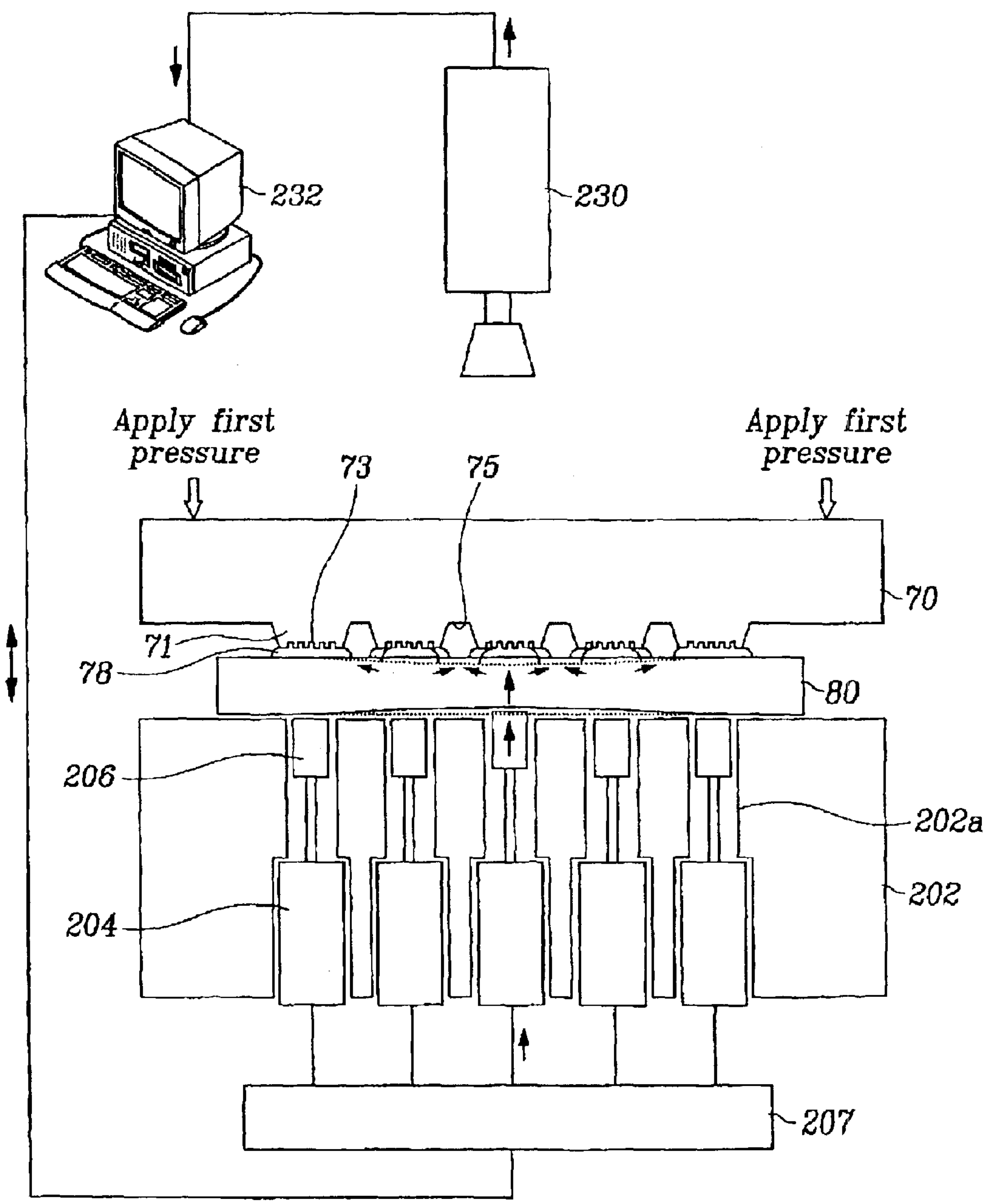
FIG. 26 is a schematic view of an operational system for the selective application of supplementary pressure in a UV nanoimprint lithography process according to an embodiment of the present invention.

FIG. 26 is a schematic view of an operational system for the selective application of supplementary pressure in a UV nanoimprint lithography process according to an embodiment of the present invention. Elements identical to those appearing in the sixth embodiment will be indicated using the same reference numerals.

As shown in the drawing, an operational system for the selective application of supplementary pressure includes a substrate table 202 on which the substrate 80 deposited with the resist 78 is placed, and an optical measuring device 230 mounted above the substrate 80 for sensing the compression state of the resist 78 deposited thereon.

At least one hole is formed in the table 202 at an area(s)of the same corresponding to where the substrate 80 is placed. The piezoelectric actuators 204, which operate as supplementary pressure devices for applying supplementary pressure to the backside of the substrate 80, are mounted within the holes. The piezoelectric actuators 204 are connected to and controlled by a device controller 207.

The optical measuring device 230 and the device controller 207 are both connected to a feedback controller 232. The feedback controller 232 transmits supplementary pressure signals to the device controller 207 according to the resist compression state transmitted from the optical measuring device 230.

The stamp used with this system may be the elementwise embossed stamp 70 or a conventional flat stamp. The supplementary pressure devices may be those as described in the seventh and eighth embodiments.

In the UV nanoimprint lithography of the present invention, supplementary pressure is selectively applied to compress the resist on the substrate when insufficiently or non-uniformly imprinted areas of the resist result by differences in the flatness of each the stamp and substrate. Therefore, when forming nanostructures on large substrates (e.g., 18-inch Si wafers) by a single-step or step-and-repeat process using large stamps (e.g., 5-inch stamps), insufficient filling of the resist is prevented and differences in the thickness of residual resist are minimized. Accordingly, high-quality and highly precise nanostructures may be formed at a relatively fast pace and at a low cost.

Although embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A UV nanoimprint lithography process for forming nanostructures on a substrate, comprising:

depositing a resist on a substrate;

contacting a stamp having formed thereon nanostructures to be transferred to an upper surface of the resist, and applying a predetermined pressure to the stamp in a direction toward the substrate, the contacting and applying being performed at room temperature and low pressure;

irradiating ultraviolet rays onto the resist;

separating the stamp from the resist; and etching an upper surface of the substrate on which the resist is deposited, wherein the stamp is an elementwise embossed stamp that comprises at least two element stamps, and grooves formed between adjacent element stamps, the grooves having a depth that is greater than a depth of nanostructures formed on the element stamps, wherein an area of the substrate is greater than an area of the stamp, wherein the steps of contacting the stamp to the upper surface of the resist, applying a predetermined pressure to the stamp, irradiating ultraviolet rays onto the resist and separating the stamp from the resist are repeatedly performed to imprint a plurality of nanostructures on overall surface of the substrate, wherein leftover areas around boundary of the imprinted substrate are imprinted by selectively using the element stamps.

2. The process of claim 1, wherein the elementwise embossed stamp is formed such that the depth of the grooves is between 2 and 1000 times greater than the depth of the nanostructures formed in the element stamps.

3. The process of claim 1, wherein the depositing a resist on a substrate is realized through spin coating.

4. The process of claim 1, wherein the depositing a resist on a substrate is realized through droplet dispensing.

5. A UV nanoimprint lithography process for forming nanostructures on a substrate, comprising:

depositing a resist on a substrate;

contacting a stamp having formed thereon nanostructures to be transferred to an upper surface of the resist, and applying a predetermined pressure to the stamp in a direction toward the substrate, the contacting and applying being performed at room temperature and low pressure;

irradiating ultraviolet rays onto the resist;

separating the stamp from the resist; and etching an upper surface of the substrate on which the resist is deposited, wherein the stamp is an elementwise embossed stamp that comprises at least two element stamps, and grooves formed between adjacent element stamps, the grooves having a depth that is greater than a depth of nanostructures formed on the element stamps, wherein the grooves formed between the element stamps of the elementwise embossed stamp are formed with slanted side walls.

6. A UV nanoimprint lithography process for forming nanostructures on a substrate, comprising:

depositing a resist on a substrate;

contacting a stamp having formed thereon nanostructures to be transferred to an upper surface of the resist, and applying a predetermined pressure to the stamp in a direction toward the substrate, the contacting and applying being performed at room temperature and low pressure;

irradiating ultraviolet rays onto the resist;

separating the stamp from the resist; and etching an upper surface of the substrate on which the resist is deposited, wherein the stamp is an elementwise embossed stamp that comprises at least two element stamps, and grooves formed between adjacent element stamps, the grooves having a depth that is greater than a depth of nanostructures formed on the element stamps, wherein the elementwise embossed stamp is made of diamond, which transmits the ultraviolet rays.

7. A UV nanoimprint lithography process for forming nanostructures on a substrate, comprising:

depositing a resist on a substrate;

contacting a stamp having formed thereon nanostructures to be transferred to an upper surface of the resist, and applying a predetermined pressure to the stamp in a direction toward the substrate, the contacting and applying being performed at room temperature and low pressure;

irradiating ultraviolet rays onto the resist;

separating the stamp from the resist; and etching an upper surface of the substrate on which the resist is deposited, wherein the stamp is an elementwise embossed stamp that comprises at least two element stamps, and grooves formed between adjacent element stamps, the grooves having a depth that is greater than a depth of nanostructures formed on the element stamps, wherein the elementwise embossed stamp is formed by carving the nanostructures on each of the element stamps by performing a microfabrication process on a surface of a transparent plate, and forming the grooves between the element stamps.

8. The process of claim 7, wherein the grooves are formed using dicing or etching.

9. A UV nanoimprint lithography process for forming nanostructures on a substrate, comprising:

depositing a resist on a substrate;

contacting a stamp having formed thereon nanostructures to be transferred to an upper surface of the resist, and applying a predetermined pressure to the stamp in a direction toward the substrate, the contacting and applying being performed at room temperature and low pressure;

irradiating ultraviolet rays onto the resist;

separating the stamp from the resist; and etching an upper surface of the substrate on which the resist is deposited, wherein the stamp is an elementwise embossed stamp that comprises at least two element stamps, and grooves formed between adjacent element stamps, the grooves having a depth that is greater than a depth of nanostructures formed on the element stamps, wherein the elementwise embossed stamp is formed by forming grooves at predetermined intervals on a plate, and engraving nanostructures on the element stamps using a microfabrication process.

10. The process of claim 9, wherein the grooves are formed using dicing or etching.

11. A UV nanoimprint lithography process for forming nanostructures on a substrate, comprising:

depositing a resist on a substrate;

contacting a stamp having formed thereon nanostructures to be transferred to an upper surface of the resist, and applying a predetermined pressure to the stamp in a direction toward the substrate, the contacting and applying being performed at room temperature and low pressure;

irradiating ultraviolet rays onto the resist;

separating the stamp from the resist; and etching an upper surface of the substrate on which the resist is deposited, wherein the stamp is an elementwise embossed stamp that comprises at least two element stamps, and grooves formed between adjacent element stamps, the grooves having a depth that is greater than a depth of nanostructures formed on the element stamps, wherein the elementwise embossed stamp is formed by cutting a UV-transmitting plate-shaped stamp on which nanostructures are engraved into each element stamp, and adhering the element stamps at predetermined intervals to a UV-transmitting plate.

12. The process of claim 11, wherein the adhering of the element stamps comprises forming shallow grooves or through holes at predetermined intervals in one side of the UV-transmitting plate, and inserting each of the element stamps into the grooves or the through holes.

13. The process of claim 11, wherein an adhesive used in the adhering of the element stamps loses its adhesivity at a predetermined temperature or greater.

14. A UV nanoimprint lithography process for forming nanostructures on a substrate, comprising:

depositing a resist on a substrate;

contacting a stamp having formed thereon nanostructures to be transferred to an upper surface of the resist, and applying a predetermined pressure to the stamp in a direction toward the substrate, the contacting and applying being performed at room temperature and low pressure;

irradiating ultraviolet rays onto the resist;

separating the stamp from the resist; and etching an upper surface of the substrate on which the resist is deposited, wherein the stamp is an elementwise embossed stamp that comprises at least two element stamps, and grooves formed between adjacent element stamps, the grooves having a depth that is greater than a depth of nanostructures formed on the element stamps, wherein the depositing a resist on a substrate is realized through droplet dispensing, wherein the droplet dispensing method comprises directly depositing resist droplets on each of the element stamps of the elementwise embossed stamp.

15. A UV nanoimprint lithography process for forming nanostructures on a substrate, comprising:

depositing a resist on a substrate;

contacting a stamp having formed thereon nanostructures to be transferred to an upper surface of the resist, and applying a predetermined pressure to the stamp in a direction toward the substrate, the contacting and applying being performed at room temperature and low pressure;

irradiating ultraviolet rays onto the resist;

separating the stamp from the resist; and etching an upper surface of the substrate on which the resist is deposited, wherein the stamp is an elementwise embossed stamp that comprises at least two element stamps, and grooves formed between adjacent element stamps, the grooves having a depth that is greater than a depth of nanostructures formed on the element stamps, wherein the depositing a resist on a substrate is realized through a spray method.

16. The process of claim 15, wherein the spray method comprises positioning a mask having formed therethrough openings corresponding to positions of each of the element stamps of the elementwise embossed stamp, and spraying the resist onto the mask to thereby deposit the resist on the substrate.

17. A UV nanoimprint lithography process for forming nanostructures on a substrate, comprising:

depositing a resist on a substrate;

contacting a stamp having formed thereon nanostructures at areas corresponding to where nanostructures on the substrate are to be formed to an upper surface of the resist, and applying a predetermined pressure to the stamp in a direction toward the substrate, the contacting and applying being performed at room temperature and low pressure;

sensing areas of the resist that are insufficiently or non-uniformly imprinted;

selectively applying a supplementary pressure to the areas of the resist that are insufficiently or non-uniformly imprinted;

irradiating ultraviolet rays onto the resist;

separating the stamp from the resist; and etching an upper surface of the substrate on which the resist is deposited.

18. The process of claim 17, wherein the stamp is a flat stamp on which nanostructures are engraved.

19. The process of claim 17, wherein the stamp is an elementwise embossed stamp that comprises at least two element stamps, and grooves formed between adjacent stamps, the grooves having a depth that is greater than a depth of nanostructures formed on the element stamps.

20. The process of claim 17, wherein the sensing areas of the resist that are insufficiently or non-uniformly imprinted comprises measuring a thickness of a resist layer deposited on the substrate using an optical measuring device.

21. The process of claim 17, wherein the sensing areas of the resist that are insufficiently or non-uniformly imprinted comprises sensing areas of compressed resist droplets that are less spread out than an area of the nanostructures carved into the stamp, the sensing being performed using an optical measuring device that is mounted above the stamp.

22. The process of claim 17, wherein the applying a supplementary pressure comprises applying a supplementary pressure to the backside of the substrate.

23. The process of claim 22, wherein the applying a supplementary pressure to the backside of the substrate comprises forming at least one hole in a table on which the substrate is placed, and installing a supplementary pressure device(s) in the hole(s) to apply the supplementary pressure.

24. The process of claim 23 wherein the supplementary pressure device is a piezoelectric actuator.

25. The process of claim 23, wherein the supplementary pressure device is a pneumatic actuator.

26. The process of claim 23, wherein the supplementary pressure device is a spring-screw mechanism.

27. The process of claim 23, wherein the supplementary pressure device comprises a plunger that provides surface contact to the backside of the substrate.

28. The process of claim 23, wherein the supplementary pressure device comprises a plunger that provides point contact to the backside of the substrate.

29. The process of claim 17, wherein the applying of a supplementary pressure comprises applying a supplementary pressure from an upper surface of the stamp.

30. The process of claim 29, wherein the applying of a supplementary pressure from an upper surface of the stamp comprises applying a supplementary pressure using supplementary pressure devices provided to corner areas of the stamp.

31. The process of claim 30, wherein the supplementary pressure device provides surface contact to the upper surface of the stamp.

* * * * *